(12) United States Patent
Kim

(10) Patent No.: US 8,642,466 B2
(45) Date of Patent: Feb. 4, 2014

(54) SEMICONDUCTOR DEVICE WITH AIR GAP AND METHOD FOR FABRICATING THE SAME

(75) Inventor: Jun-Ki Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 13/607,012

(22) Filed: Sep. 7, 2012

(65) Prior Publication Data
US 2013/0320550 A1  Dec. 5, 2013

(30) Foreign Application Priority Data

May 31, 2012  (KR) .......................... 10-2012-0058435

(51) Int. Cl.
*H01L 21/4763*  (2006.01)

(52) U.S. Cl.
USPC ........................................................ 438/619

(58) Field of Classification Search
USPC ........................................................ 438/619
See application file for complete search history.

(56) References Cited

U.S. PATENT DOCUMENTS

| 6,184,121 | B1 * | 2/2001 | Buchwalter et al. | 438/622 |
| 6,228,756 | B1 * | 5/2001 | Lee | 438/619 |
| 6,413,852 | B1 * | 7/2002 | Grill et al. | 438/619 |
| 6,448,177 | B1 * | 9/2002 | Morrow et al. | 438/638 |
| 6,995,073 | B2 * | 2/2006 | Liou | 438/421 |
| 7,947,566 | B2 * | 5/2011 | Chen et al. | 438/422 |
| 8,129,264 | B2 * | 3/2012 | Kim et al. | 438/619 |
| 2007/0212839 | A1 | 9/2007 | Chung et al. | |

FOREIGN PATENT DOCUMENTS

| KR | 1020000056249 | 9/2000 |
| KR | 1020070098319 | 10/2007 |
| KR | 1020100121884 | 11/2010 |
| KR | 1020120007219 | 1/2012 |
| KR | 101164972 | 7/2012 |
| KR | 1020120121727 | 11/2012 |

* cited by examiner

*Primary Examiner* — Jenny L Wagner
(74) *Attorney, Agent, or Firm* — IP & T Group LLP

(57) ABSTRACT

A method for fabricating a semiconductor device includes forming a plurality of bit line structures over a substrate, forming multiple layers of spacer layers with a capping layer interposed therebetween over the bit line structures, exposing a surface of the substrate by selectively etching the spacer layers, forming air gaps and capping spacers for covering upper portions of the air gaps by selectively etching the capping layer, and forming storage node contact plugs between the bit line structures.

30 Claims, 21 Drawing Sheets

SEMICONDUCTOR DEVICE WITH AIR GAP AND METHOD FOR FABRICATING THE SAME

CROSS-REFERENCE TO RELATED APPLICATIONS

The present application claims priority of Korean Patent Application No. 10-2012-0058435, filed on May 31, 2012, which is incorporated herein by reference in its entirety.

BACKGROUND

1. Field

Exemplary embodiments of the present invention relate to a semiconductor device, and more particularly, to a semiconductor device with air gaps and a method for fabricating the semiconductor device.

2. Description of the Related Art

Generally, a semiconductor device includes a plurality of first conductive layer patterns and a plurality of second conductive layer patterns. Each second conductive layer pattern is formed between the first conductive layer patterns, but an insulation is between the first conductive layer pattern and the second conductive layer pattern. The first conductive layer patterns may include a gate electrode, bit lines, and metal lines. The second conductive layer patterns may include contact plugs, storage node contact plugs, bit line contact plugs, and vias.

As semiconductor devices are highly integrated, the distance between the first conductive layer pattern and the second conductive layer pattern becomes shorter. The narrower space between the first conductive layer pattern and the second conductive layer pattern may raise a parasitic capacitance between the first conductive layer pattern and the second conductive layer pattern. In particular, a Dynamic Random Access Memory (DRAM) device including bit lines laid adjacent to storage node contact plugs may have a slow operation speed and a deteriorated refresh characteristic because of the increase in the parasitic capacitance between the bit line and the storage node contact plug.

To reduce the parasitic capacitance, the confrontation area between the first conductive layer pattern and the second conductive layer pattern may be minimized, or it may be required to keep a distance between the conductive layer patterns. However, there is limitation in increasing the distance between the conductive layer patterns because the size of semiconductor device products is decreased. Also, one of the ways suggested for reducing the confrontation area is to decrease the heights of the first conductive layer patterns or the second conductive layer patterns. However, the lowering height is necessarily accompanied with the increased resistance of conductive layer patterns.

Therefore, one of the best ways to reduce the parasitic resistance is to decrease the dielectric constant of the insulation layer. Generally, a silicon oxide layer and a silicon nitride layer are used as insulation layers for semiconductor devices. The dielectric constant (k) of the silicon oxide layer is approximately 4, and the dielectric constant (k) of the silicon nitride layer is approximately 7.

Since the silicon oxide layer and the silicon nitride layer still have high dielectric constants, there may be limitation in decreasing the parasitic capacitance. Recently, some layers having relatively low dielectric constants, such as silicon boron nitride (SiBN) and silicon carbon nitride (SiCN), are under development, but their dielectric constants approach approximately 6, which may be not sufficiently low.

SUMMARY

An embodiment of the present invention is directed to a semiconductor device having a decreased parasitic capacitance between a bit line and a storage node contact plug, and a method for fabricating the semiconductor device.

In accordance with an embodiment of the present invention, a method for fabricating a semiconductor device includes forming a plurality of bit line structures over a substrate; forming multiple layers of spacer layers with a capping layer interposed therebetween over the bit line structures; exposing a surface of the substrate by selectively etching the spacer layers; forming air gaps and capping spacers for covering upper portions of the air gaps by selectively etching the capping layer; and forming storage node contact plugs between the bit line structures.

In accordance with another embodiment of the present invention, a method for fabricating a semiconductor device includes forming a plurality of bit line structures over a substrate; forming multiple layers of spacer layers with a capping layer interposed therebetween over the bit line structures; exposing a surface of the substrate by selectively etching the spacer layers; forming air gaps and capping spacers for capping upper portions of the air gaps by selectively etching the capping layer; forming an air gap lower capping layer for capping lower portions of the air gaps; and forming storage node contact plugs between the bit line structures where the air gap lower capping layer is formed.

In accordance with yet another embodiment of the present invention, a method for fabricating a semiconductor device includes forming a plurality of bit line structures over a substrate; forming a capping layer over the bit line structures; forming a spacer layer over the capping layer; exposing a surface of the substrate by selectively etching the spacer layer and the capping layer; forming air gaps and capping spacers for capping upper portions of the air gaps by selectively etching the capping layer; forming an air gap lower capping layer for capping lower portions of the air gaps; and forming storage node contact plugs between the bit line structures where the air gap lower capping layer is formed.

In accordance with still another embodiment of the present invention, a method for fabricating a semiconductor device includes forming a plurality of bit line structures over a substrate; forming a first spacer layer over the bit line structures; forming a capping layer and a second spacer layer over the first spacer layer; selectively etching the second spacer layer and the capping layer; forming air gaps and capping spacers for capping upper portions of the air gaps by selectively etching the capping layer; forming an air gap lower capping layer for capping lower portions of the air gaps; exposing a surface of the substrate by selectively etching the air gap lower capping layer and the first spacer layer; and forming storage node contact plugs between the bit line structures.

In accordance with still another embodiment of the present invention, a semiconductor device includes a plurality of bit line structures provided over a substrate; a plurality of storage node contact plugs located between the bit line structures; air gaps formed between the bit line structures and the storage node contact plugs; capping spacers configured to cover upper portions of the air gaps and upper portions of the bit line structures; spacers configured to cover the bit line structures and the capping spacers; and an air gap lower capping layer configured to cover the spacers while capping lower portions of the air gaps.

DETAILED DESCRIPTION

Figure 1:
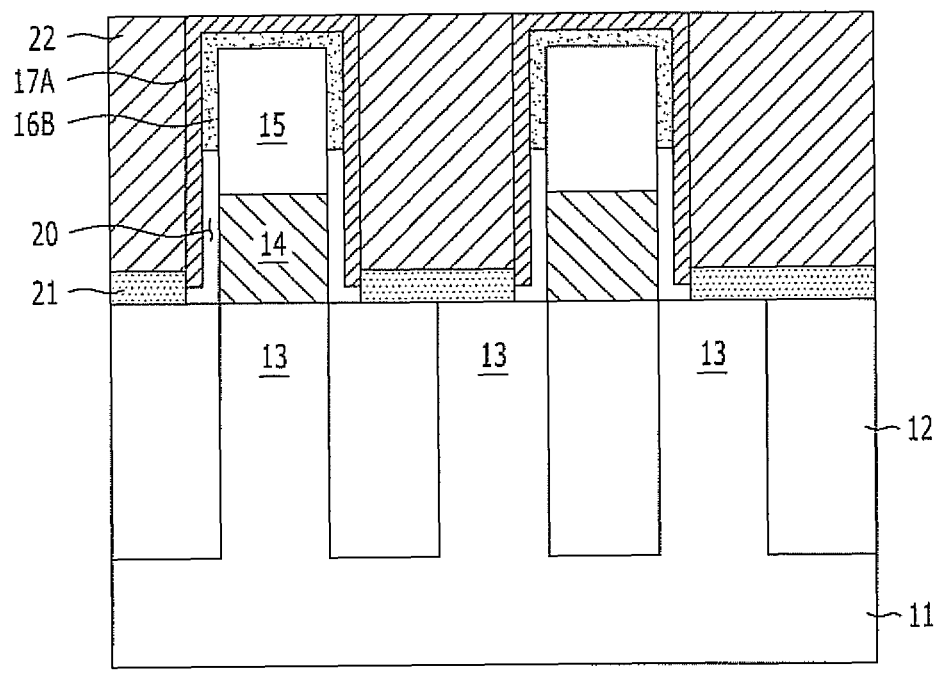
FIG. 1 is a cross-sectional view illustrating a semiconductor device in accordance with an embodiment of the present invention.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

FIG. 1 is a cross-sectional view illustrating a semiconductor device in accordance with an embodiment of the present invention.

Referring to FIG. 1, a plurality of bit line structures are formed over a semiconductor substrate 11. Each of the bit line structures includes a bit line 14 and a hard mask layer pattern 15 stacked therein. The bit lines 14 may include a conductive material, such as polysilicon, metal, metal nitride, and metal silicide. The bit lines 14 may be formed of any one of the named conductive materials, or the bit lines 14 may be of a stacked structure where at least two of the named conductive materials are stacked. The bit lines 14 may be of a type of lines stretched in any one direction. Although not illustrated in the drawing, a lower structure and an inter-layer dielectric layer may be further formed over the semiconductor substrate 11. The lower structure may include a conductive material, such as polysilicon, metal, metal nitride, and metal silicide. The inter-layer dielectric layer may include a silicon oxide and a silicon nitride. The inter-layer dielectric layer may cover the lower structure, and the lower structure may be a plug penetrating through the inter-layer dielectric layer. The lower structure may be formed under the bit lines 14, and the lower structure may be exposed between the bit lines 14. For example, an isolation layer 12 and active regions 13 may be formed under the bit lines 14. Also, although not illustrated in the drawing, gate structures such as buried gates may be formed. The bit lines 14 may be regularly disposed with a uniform space between them over the semiconductor substrate 11.

Storage node contact plugs 22 are formed between the multiple bit lines 14. The storage node contact plugs 22 may include a conductive material, such as polysilicon, metal, metal nitride, and metal silicide. The storage node contact plugs 22 may be formed of any one among the named conductive materials, or the storage node contact plugs 22 may be of a stacked structure where at least two of the conductive materials are stacked. The storage node contact plugs 22 may be regularly disposed over the semiconductor substrate 11.

Spacers 17A are formed between the bit lines 14 and the storage node contact plugs 22. The spacers 17A may include an insulation layer. The spacers 17A may be formed of a material having a low dielectric constant in order to decrease the parasitic capacitance between the bit lines 14 and the storage node contact plugs 22. The spacers 17A may include nitride, such as silicon nitride ($Si_3N_4$).

Air gaps 20, like empty space, are formed between the spacers 17A and the bit lines 14, and capping spacers 16B are formed in the upper portions of the air gaps 20. The capping spacers 16B may have an isolated shape that covers the upper sidewalls and upper portions of the hard mask layer patterns 15. The capping spacers 16B may be formed of a material that has a different dielectric constant from that of the spacers 17A. The capping spacers 16B have a height that does not affect the parasitic capacitance between the bit lines 14 and the storage node contact plugs 22. The air gaps 20 may be formed by removing a portion of each capping spacer 16B. Because the air gaps 20 have a dielectric constant of '1', the parasitic capacitance between the bit lines 14 and the storage node contact plugs 22 may be remarkably reduced. The capping spacers 16B cap the upper portions of the air gaps 20.

An air gap lower capping layer 21 is formed under the storage node contact plugs 22 to hermetically seal the lower portions of the air gaps 20. The air gap lower capping layer 21 may be a silicon layer. The air gap lower capping layer 21 may be formed through a Selective Epitaxial Growth process. As a result an elevated structure may be formed.

According to FIG. 1, the air gaps 20 are formed between the bit lines 14 and the storage node contact plugs 22. The lower portions of the air gaps 20 are hermetically sealed by the air gap lower capping layer 21. The air gaps 20 have a dielectric constant of '1' and the air gaps 20 may remarkably reduce the parasitic capacitance between the bit lines 14 and the storage node contact plugs 22.

In accordance with an embodiment of the present invention, it does not have to additionally form a capping layer for hermetically sealing the air gaps 20. In other words, since the air gaps 20 are formed by removing a portion of each capping spacer 16B from the lower portion of each bit line 14, the capping spacers 16B for capping the air gaps 20 are formed to be self-aligned.

Also, the air gap lower capping layer 21 not only hermetically seals the lower portions of the air gaps 20 but also prevents the bit lines 14 and the storage node contact plugs 22 against electrical short.

FIGS. 2A to 2F are cross-sectional views illustrating a method for fabricating the semiconductor device in accordance with an embodiment of the present invention.

Figure 2A:
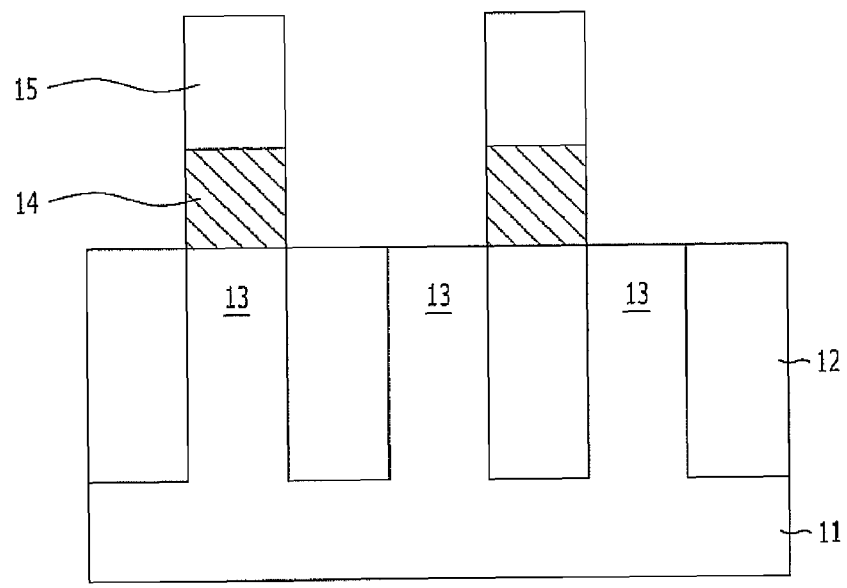
FIGS. 2A to 2F are cross-sectional views illustrating a method for fabricating the semiconductor device in accordance with an embodiment of the present invention.

Referring to FIG. 2A, the isolation layer 12 is formed over the semiconductor substrate 11. The isolation layer 12 is formed through a Shallow Trench Isolation (STI) process. The isolation layer 12 defines a plurality of active regions 13. Although not illustrated in the drawing, a process of forming buried gates BG may be performed after the isolation layer 12 is formed. The buried gates are formed through processes well known to people skilled in the art. The active regions 13 may include active regions to be coupled with the bit lines 14 and active regions to be coupled with the storage node contact plugs 22.

Subsequently, bit line structures where the bit lines 14 and the hard mask layer patterns 15 are stacked are formed on the surface of some active regions 13 among the multiple active regions 13. The bit line structures may have a type of lines that simultaneously penetrate the active regions 13 and the isolation layer 12. The hard mask layer patterns 15 may include a silicon nitride. The bit lines 14 may include a conductive material, such as a semiconductor material doped with an impurity, a metal, a metal nitride, and/or a metal silicide. The bit lines 14 may be formed of any one among the named conductive materials, or the bit lines 14 may be of a stacked structure where at least two of the conductive materials are stacked. For example, the bit lines 14 may be formed of one selected from the group consisting of a polysilicon, a tungsten, a titanium, an aluminum, a copper, a tantalum, a cobalt, a silicon, an iron, a nickel, and combinations thereof. In the embodiment of the present invention, the bit lines 14 may include tungsten. The bit lines 14 may have a type of lines that are stretched in any one direction. The bit lines 14 may be regularly disposed with a uniform distance between them over the semiconductor substrate 11. The bit lines 14 may have a shape of lines formed on the surface of the isolation layer 12 while being formed on the surface of the active regions 13. Although not illustrated, plugs (not shown) may be further formed under the bit lines 14.

The bit lines 14 may be formed through the following method. A first conductive layer (not shown) is formed over the semiconductor substrate 11. Line-type hard mask layer patterns 15 are formed in a shape of lines that are regularly arrayed with a uniform distance from each other over the first conductive layer. The first conductive layer is etched using the hard mask layer patterns 15 as an etch barrier. As a result, the bit lines 14 are formed. The hard mask layer patterns 15 may be formed through a photolithography process.

Figure 2B:
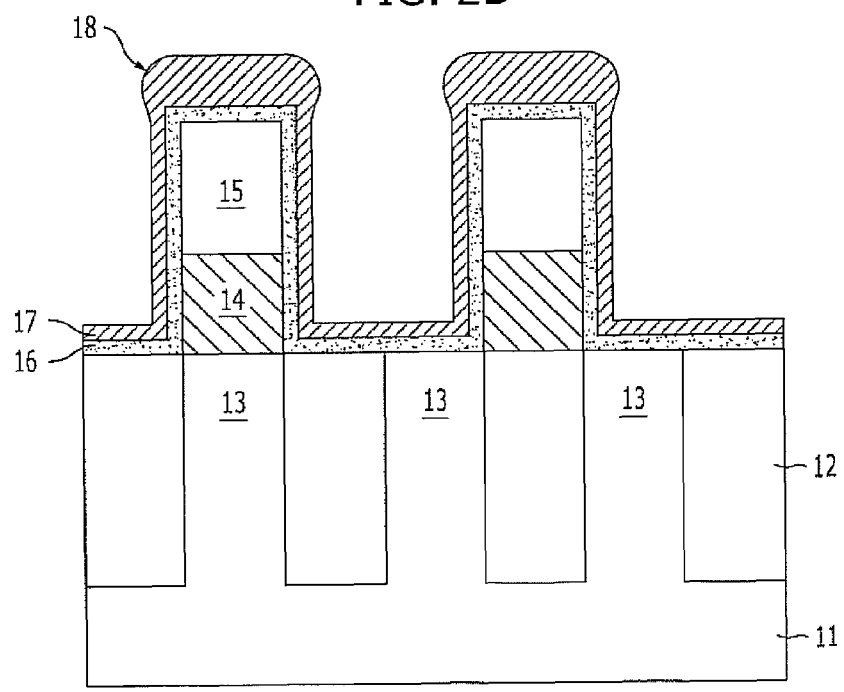

Referring to FIG. 2B, a spacer layer is formed over the profile of the substrate structure including the bit line structures. The spacer layer is to be used as bit line spacers. The spacer layer may be formed of a material selected from the group consisting of silicon, titanium nitride, silicon nitride, silicon oxide, and silicon oxynitride. The spacer layer may be formed of any one among the named materials, or a stacked structure where two or more of the named materials are stacked.

In accordance with the embodiment of the present invention, the spacer layer may be formed by stacking a first spacer layer 16 and a second spacer layer 17. The first spacer layer 16 and the second spacer layer 17 may be formed of materials having an etch selectivity. For example, the first spacer layer 16 may include silicon oxide, while the second spacer layer 17 may include silicon nitride. Therefore, the spacer layer may have a structure of oxide-nitride (ON). The silicon oxide may be deposited through a Chemical Vapor Deposition (CVD) process. The second spacer layer 17 may be formed through a Physical Vapor Deposition (PVD) process or a Plasma Enhanced Chemical Vapor Deposition (PECVD) process, which are known as a process having poor step coverage. Through the process, upper portions of the second spacer layer 17 may be deposited thick (refer to reference numeral '18') over upper edges of the bit line structures. As a result, a profile called overhang may be obtained. According to another embodiment of the present invention, the second spacer layer 17 is deposited conformally, and then a third spacer layer (not shown) may be formed to be particularly thick over the bit line structures. For example, the third spacer layer may be formed through the PVD process or the PECVD process. The third spacer layer may include silicon nitride, or a material that may protect the upper portions of the bit line structures when silicon nitride and silicon oxide are etched out. For example, the third spacer layer may include a metal. According to another embodiment of the present invention, the first spacer layer 16 may include a titanium nitride (TiN), and the second spacer layer 17 may include an oxide or a nitride. Therefore, the first spacer layer 16 and the second spacer layer 17 may have a structure of TiN-oxide (TO) or a structure of TiN-nitride (TN).

Figure 2C:
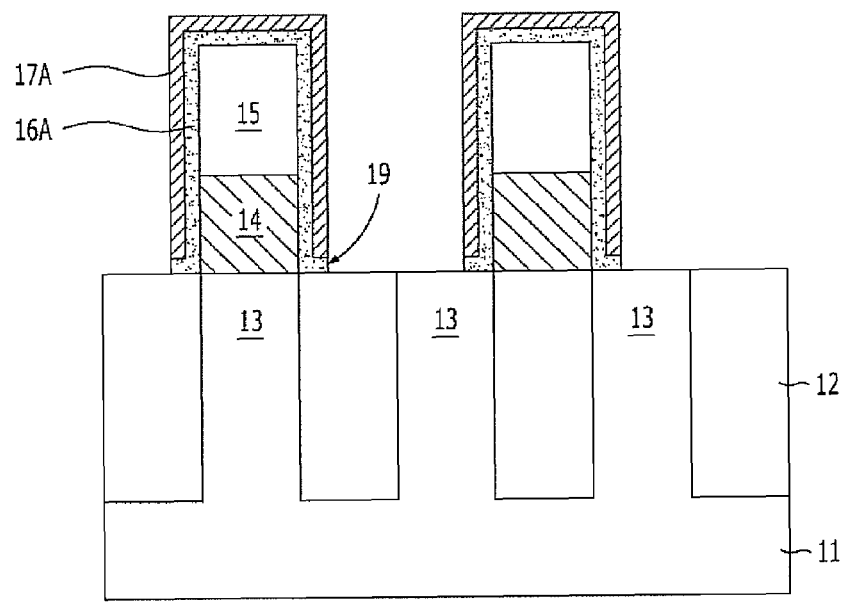

Referring to FIG. 2C, the surface of the semiconductor substrate 11 between the bit line structures is exposed by selectively removing the first spacer layer 16 and the second spacer layer 17. An etch-back process may be performed to remove the first spacer layer 16 and the second spacer layer 17 from the surface of the semiconductor substrate 11. After the etch-back process, capping spacers 16A and spacers 17A may be formed. The capping spacers 16A and the spacers 17A may remain in the upper portion and both sidewalls of each bit line structure. During the etch-back process, the capping spacers 16A are not exposed in the upper portions of the hard mask layer patterns 15. The capping spacers 16A may be exposed in the lower sidewalls of the bit lines 14, referring to reference numeral '19'.

Figure 2D:
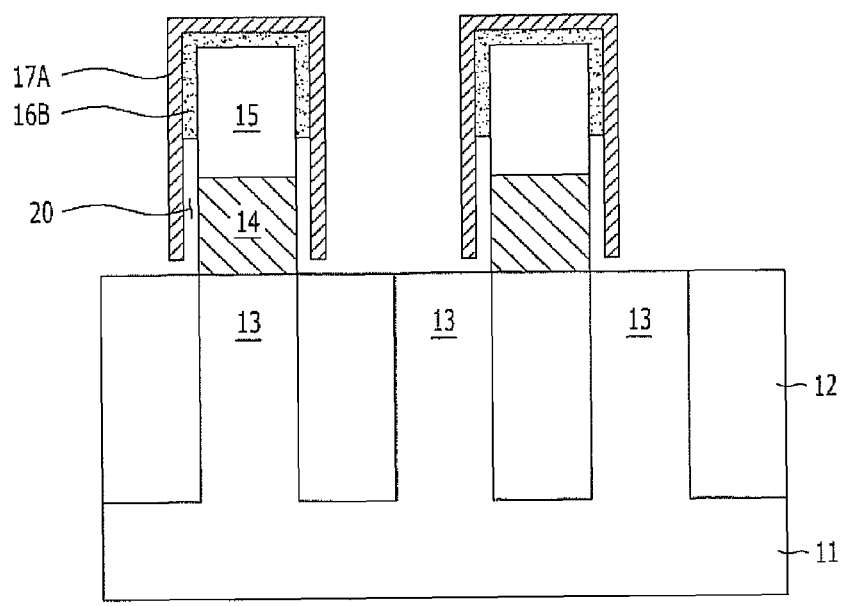

Referring to FIG. 2D, a portion of each capping spacer 16A is selectively removed. Since the spacers 17A and the capping spacers 16A are formed of the materials having an etch selectivity, a portion of each capping spacer 16A is removed by using a chemical that may selectively etch only the capping spacers 16A. When the capping spacers 16A are formed of silicon oxide, a chemical including hydrogen fluoride (HF) may be used. When the capping spacers 16A are formed of silicon nitride, a chemical including phosphoric acid ($H_3PO_4$) may be used. When the capping spacers 16A are formed of titanium nitride, a chemical including a mixed solution of sulfuric acid ($H_2SO_4$) and hydrogen peroxide ($H_2O_2$) may be used.

Through a wet-etch process, the capping spacers 16A are etched from the lower portions of the bit lines 14. When the capping spacers 16A are removed, the spacers 17A are not etched because of different etch selectivity against the capping spacers 16A. Also, the isolation layer 12 is not etched either because of different etch selectivity against the capping spacers 16A.

As described above, when a portion of each capping spacer 16A is etched from the lower sidewalls of the bit lines 14, air gaps 20, which are empty space between the bit lines 14 and the spacers 17A, are formed. After the formation of the air gaps 20, capping spacers 16B, which are obtained from the above process of partially etching a portion of each capping spacer 16A, are formed in an isolated structure surrounding the upper portions and upper sidewalls of the hard mask layer patterns 15. As a result, the spacers 17A cover the capping spacers 16B, and the air gaps 20 are located under the capping spacers 16B. The capping spacers 16B have an isolated structure surrounding the upper portions and upper sidewalls of the hard mask layer patterns 15. The height of the air gaps 20 may be at least the same as or higher than the upper surface of the bit lines 14.

Figure 2E:
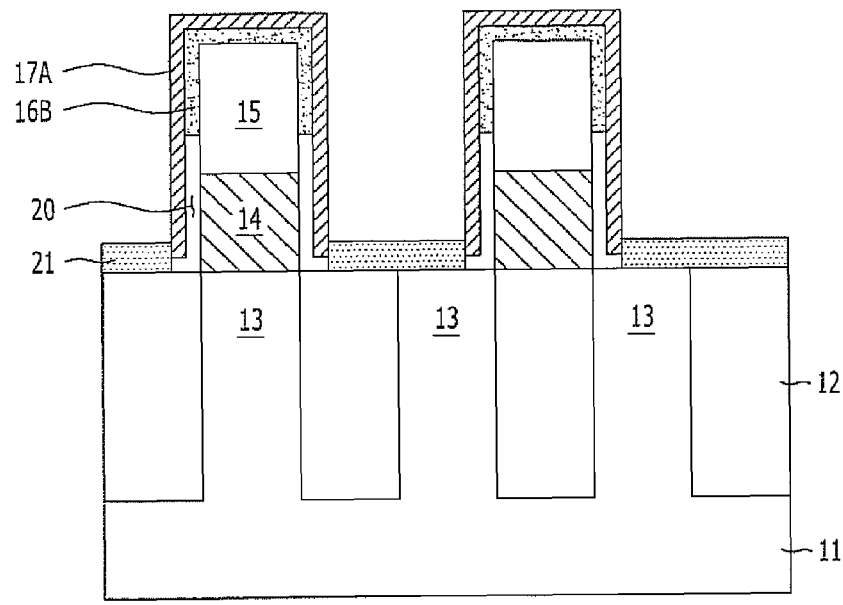

Referring to FIG. 2E, an air gap lower capping layer 21 is formed over the semiconductor substrate 11 between the bit line structures where the air gaps 20 are formed. The air gap lower capping layer 21 may be formed through a Selective Epitaxial Growth (SEG) process. For example, the air gap lower capping layer 21 may be a silicon layer. The air gap lower capping layer 21 hermetically seals the lower portions of the air gaps 20. Also, when storage node contact plugs are formed later, the air gap lower capping layer 21 prevents the storage node contact plugs and the bit lines 14 against electrical short.

Figure 2F:
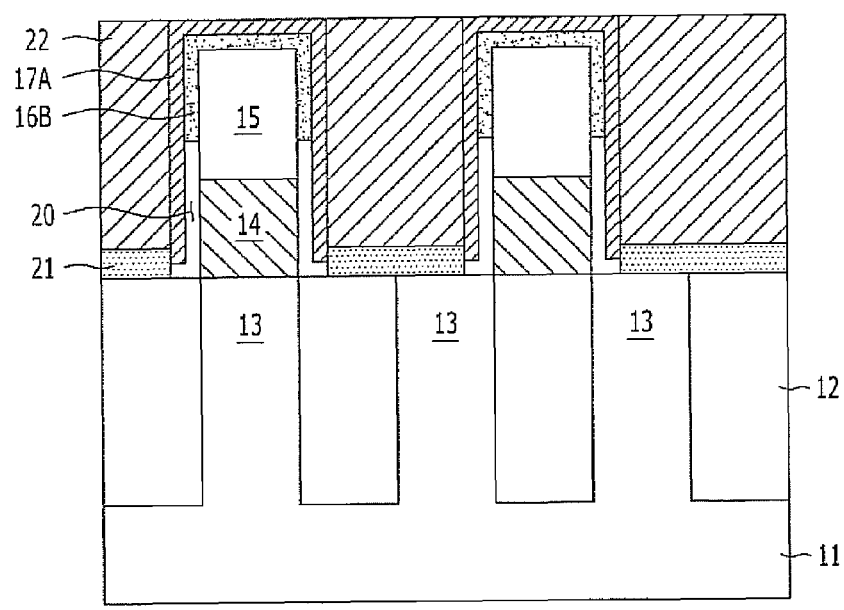

Referring to FIG. 2F, a conductive layer is formed over the air gap lower capping layer 21 between the bit line structures for gap-filling. Subsequently, storage node contact plugs 22 are formed by planarizing the conductive layer. The planarization process stops at the spacers 17A.

The storage node contact plugs 22 may be a conductive layer including a conductive material, such as a semiconductor material doped with an impurity, metal, metal nitride, and metal silicide. The storage node contact plugs 22 may be formed of any one among the named conductive materials or the storage node contact plugs 22 may have a stacked structure where at least two of the conductive layers are stacked. In accordance with the embodiment of the present invention, the storage node contact plugs 22 may include polysilicon.

Figure 3:
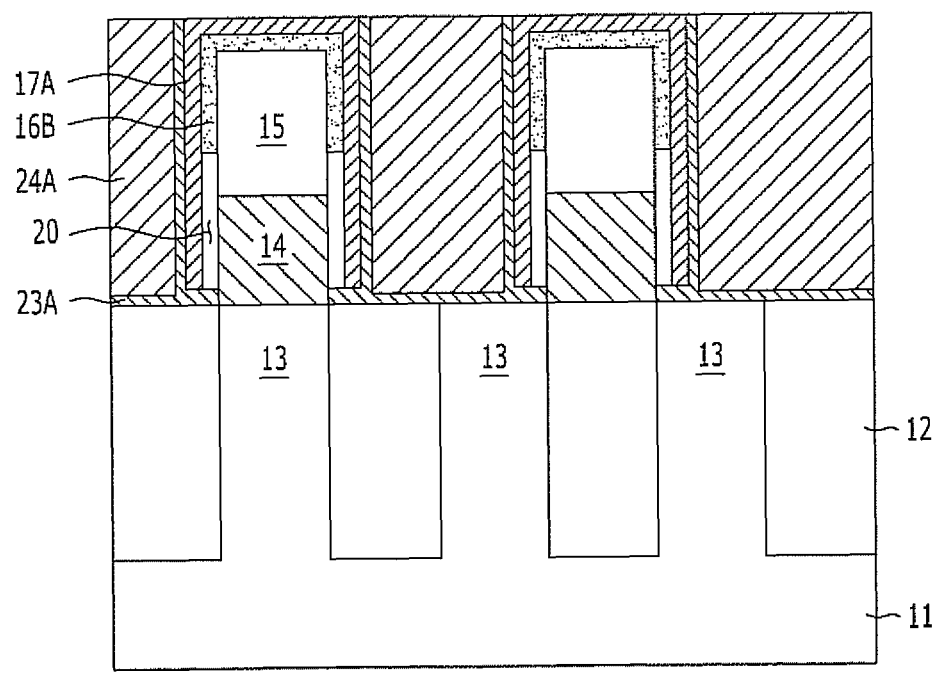
FIG. 3 is a cross-sectional view illustrating a semiconductor device in accordance with an embodiment of the present invention.

FIG. 3 is a cross-sectional view illustrating a semiconductor device in accordance with an embodiment of the present invention.

Referring to FIG. 3, a plurality of bit line structures are formed over a semiconductor substrate 11. Each of the bit line structures includes a bit line 14 and a hard mask layer pattern 15 stacked therein. The bit lines 14 may include a conductive material, such as a polysilicon, a metal, a metal nitride, and a metal silicide. The bit lines 14 may be formed of any one of the named conductive materials, or the bit lines 14 may be of a stacked structure where at least two of the named conductive materials are stacked. The bit lines 14 may be of a type of lines stretched in any one direction. Although not illustrated in the drawing, a lower structure and an inter-layer dielectric layer may be further formed over the semiconductor substrate 11. The lower structure may include a conductive material, such as polysilicon, metal, metal nitride, and metal silicide. The inter-layer dielectric layer may include a silicon oxide and a silicon nitride. The inter-layer dielectric layer may cover the lower structure, and the lower structure may be a plug penetrating through the inter-layer dielectric layer. The lower structure may be formed under the bit lines 14, and the lower structure may be exposed between the bit lines 14. For example, an isolation layer 12 and active regions 13 may be formed under the bit lines 14. Also, although not illustrated in the drawing, gate structures such as buried gates may be formed. The bit lines 14 may be regularly disposed with a uniform space between them over the semiconductor substrate 11.

Storage node contact plugs 24A are formed between the multiple bit lines 14. The storage node contact plugs 24A may include a conductive material, such as polysilicon, metal, metal nitride, and metal silicide. The storage node contact plugs 24A may be formed of any one among the named conductive materials, or the storage node contact plugs 24A may be of a stacked structure where two or more of the conductive materials are stacked. The storage node contact plugs 24A may be regularly disposed over the semiconductor substrate 11.

Spacers 17A are formed between the bit lines 14 and the storage node contact plugs 24A. The spacers 17A may include an insulation layer. The spacers 17A may be formed of a material having a low dielectric constant in order to decrease the parasitic capacitance between the bit lines 14 and the storage node contact plugs 24A. The spacers 17A may include a nitride, such as a silicon nitride ($Si_3N_4$).

Air gaps 20 are formed between the spacers 17A and the bit lines 14. Capping spacers 16B are formed in the upper portions of the air gaps 20. The capping spacers 16B may have an isolated shape that covers the upper sidewalls and upper portions of the hard mask layer patterns 15. The capping spacers 16B may be formed of a material that has a different dielectric constant from the spacers 17A. The capping spacers 16B have a height that does not affect the parasitic capacitance between the bit line 14 and the storage node contact plug 24A. The air gaps 20 may be formed by removing a portion of each capping spacer 16B. Because the air gaps 20 have a dielectric constant of '1', the parasitic capacitance between the bit lines 14 and the storage node contact plugs 24A may be remarkably reduced. The capping spacers 16B cover the upper portions of the air gaps 20.

A spacer-type air gap lower capping layer 23A is formed between the storage node contact plugs 24A and the spacers 17A to hermetically seal the lower portions of the air gaps 20. The air gap lower capping layer 23A may be a silicon layer. The air gap lower capping layer 23A may be formed over the active regions 13 and the isolation layer 12 as well.

According to FIG. 3, the air gaps 20 are formed between the bit lines 14 and the storage node contact plugs 24A. The lower portions of the air gaps 20 are hermetically sealed by the air gap lower capping layer 23A. Because the air gaps 20 have a dielectric constant of '1', the air gaps 20 may remarkably reduce the parasitic capacitance between the bit lines 14 and the storage node contact plugs 24A.

In accordance with the embodiment of the present invention, it does not have to additionally form a capping layer configured to hermetically seal the air gaps 20. In other words, since the air gaps 20 are formed by removing a portion of each capping spacer 16B from the lower portion of each bit line 14, the capping spacers 16B for capping the air gaps 20 are formed to be self-aligned.

Also, the air gap lower capping layer 23A not only hermetically seals the lower portions of the air gaps 20 but also prevents the bit lines 14 and the storage node contact plugs 24A from electrically shorting.

Figure 4A:
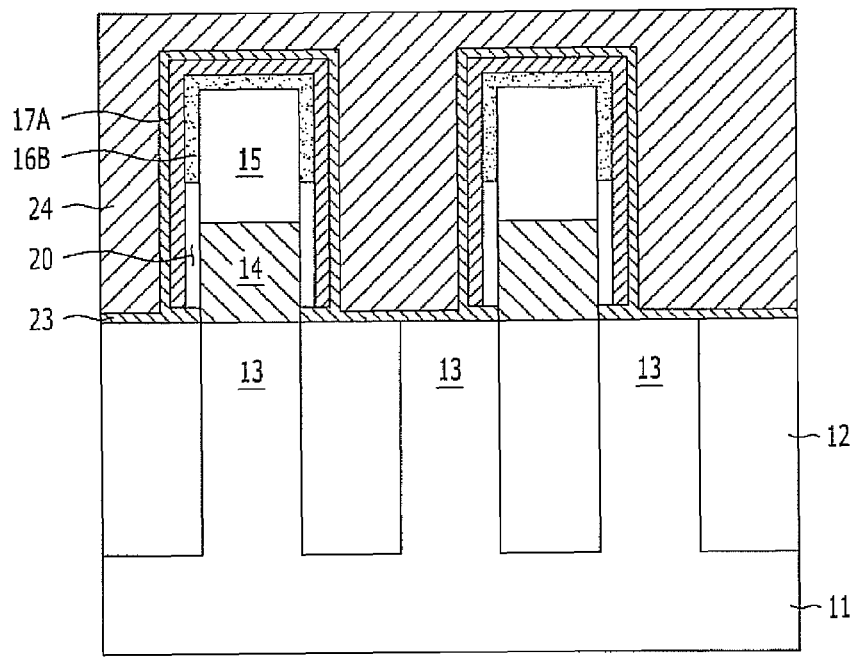
FIGS. 4A and 4B are cross-sectional views illustrating a method for fabricating the semiconductor device in accordance with an embodiment of the present invention.
Figure 4B:
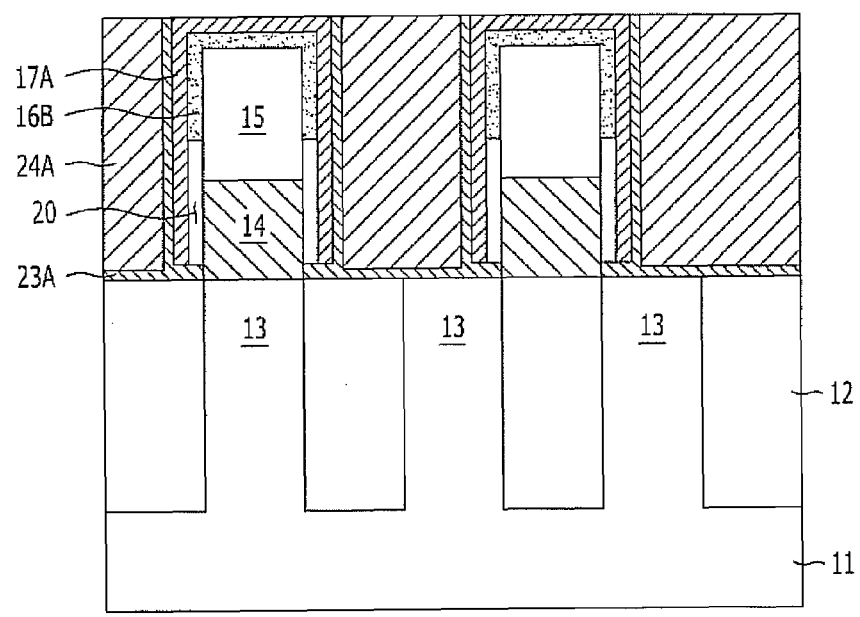

FIGS. 4A and 4B are cross-sectional views illustrating a method for fabricating the semiconductor device in accordance with an embodiment of the present invention. The fabrication process may be performed, which is like that of the above described embodiment, except for the process of forming the air gap lower capping layer.

In other words, after the formation of the air gaps 20, as illustrated in FIG. 4A, an air gap lower capping layer 23 is formed over the profile of the semiconductor substrate 11 including the bit line structures where the air gaps 20 are formed. The air gap lower capping layer 23 may include polysilicon. The air gap lower capping layer 23 may be formed through a Low-Pressure Chemical Vapor Deposition (LPCVD) process.

The air gap lower capping layer 23 hermetically seals the lower portions of the air gaps 20. Also, when storage node contact plugs are formed, the air gap lower capping layer 23 prevents the storage node contact plugs and the bit lines 14 from electrically shorting.

Subsequently, a conductive layer 24 is formed over the air gap lower capping layer 23. As a result, the conductive layer 24 may gap-fill the space between the bit line structures. The conductive layer 24 may be formed of a material selected from the group consisting of a polysilicon doped with an impurity, a metal, a metal a nitride, and a metal silicide. The conductive layer 24 may be formed of any one among the named materials, or the conductive layer 24 may have a stacked structure where two or more of the named materials are stacked.

Referring to FIG. 4B, the conductive layer 24 is planarized. The planarization of the conductive layer 24 stops at the surface of the spacers 17A in the upper portions of the bit line structure. As a result, storage node contact plugs 24A are formed between the bit line structures. An air gap lower capping layer 23A is formed between the spacers 17A and the air gap lower capping layer 23A.

Figure 5:
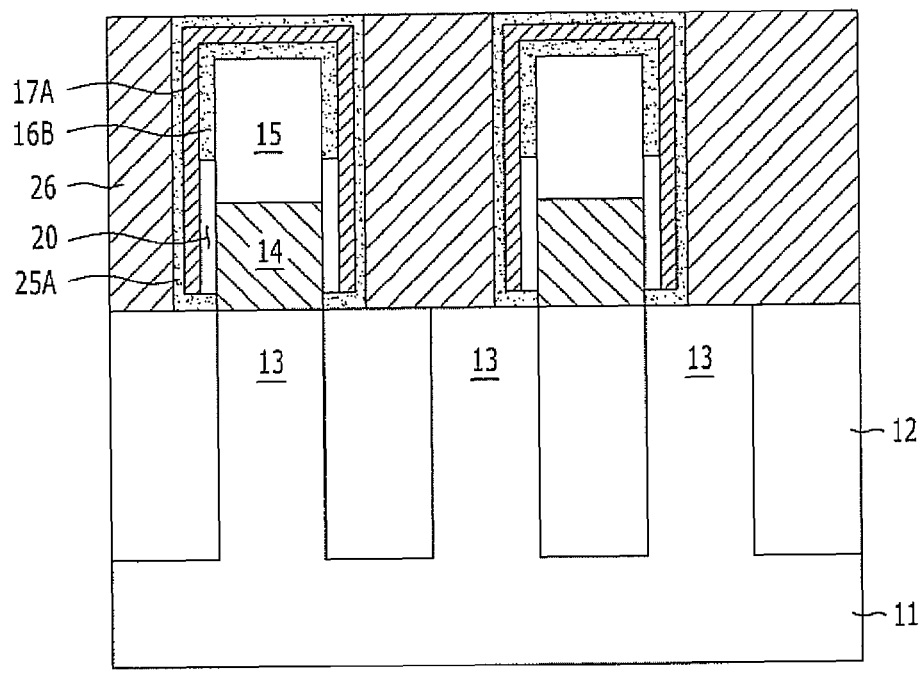
FIG. 5 is a cross-sectional view illustrating a semiconductor device in accordance with an embodiment of the present invention.

FIG. 5 is a cross-sectional view illustrating a semiconductor device in accordance with an embodiment of the present invention.

Referring to FIG. 5, a plurality of bit line structures are formed over a semiconductor substrate 11. Each of the bit line structures includes a bit line 14 and a hard mask layer pattern 15 stacked therein. The bit lines 14 may include a conductive material, such as a polysilicon, a metal, a metal nitride, and a metal silicide. The bit lines 14 may be formed of any one of the named conductive materials, or a structure where two ore more of the named conductive materials are stacked. The bit lines 14 may be of a type of lines stretched in any one direction. Although not illustrated in the drawing, a lower structure and an inter-layer dielectric layer may be further formed over the semiconductor substrate 11. The lower structure may include a conductive material, such as a polysilicon, a metal, a metal nitride, and a metal silicide. The inter-layer dielectric layer may include a silicon oxide and a silicon nitride. The inter-layer dielectric layer may cover the lower structure, and the lower structure may be a plug penetrating through the inter-layer dielectric layer. The lower structure may be formed under the bit lines 14. The lower structure may be exposed between the bit lines 14. For example, an isolation layer 12 and active regions 13 may be formed under the bit lines 14. Also, although not illustrated in the drawing, gate structures such as buried gates may be formed. The bit lines 14 may be regularly disposed with a uniform space between them over the semiconductor substrate 11.

Storage node contact plugs 26 are formed between the multiple bit lines 14. The storage node contact plugs 26 may include a conductive material, such as a polysilicon, a metal, a metal nitride, and a metal silicide. The storage node contact plugs 26 may be formed of any one among the named conductive materials, or a stacked structure including two or more conductive materials. The storage node contact plugs 26 may be regularly disposed over the semiconductor substrate 11.

Spacers 17A are formed between the bit lines 14 and the storage node contact plugs 26. The spacers 17A may include an insulation layer. The spacers 17A may be formed of a material having a low dielectric constant in order to decrease the parasitic capacitance between the bit lines 14 and the storage node contact plugs 26. The spacers 17A may include a nitride, such as a silicon nitride ($Si_3N_4$).

Air gaps 20 are formed between the spacers 17A and the bit lines 14. Capping spacers 16B are formed in the upper portions of the air gaps 20. The capping spacers 16B may have an isolated shape that covers the upper sidewalls and upper portions of the hard mask layer patterns 15. The capping spacers 16B may be formed of a material that has a different dielectric constant from the spacers 17A. The capping spacers 16B have a height that does not affect the parasitic capacitance between the bit line 14 and the storage node contact plug 26. The air gaps 20 may be formed by removing a portion of each capping spacer 16B. Because the air gaps 20 have a dielectric constant of '1', the parasitic capacitance between the bit lines 14 and the storage node contact plugs 26 may be remarkably reduced. The capping spacers 16B cover the upper portions of the air gaps 20.

A spacer-type air gap lower capping layer 25A is formed between the storage node contact plugs 26 and the spacers 17A to hermetically seal the lower portions of the air gaps 20. The air gap lower capping layer 25A may be a silicon layer. The air gap lower capping layer 25A may be formed over the active regions 13 and the isolation layer 12 as well.

According to FIG. 5, the air gaps 20 are formed between the bit lines 14 and the storage node contact plugs 26. The lower portions of the air gaps 20 are hermetically sealed by the air gap lower capping layer 25A. The air gaps 20 have a dielectric constant of '1', thus the air gaps 20 may remarkably reduce the parasitic capacitance between the bit line 14 and the storage node contact plug 26.

In accordance with the embodiment of the present invention, it does not have to additionally form a capping layer for hermetically sealing the air gaps 20. In other words, since the air gaps 20 are formed by removing a portion of each capping spacer 16B from the lower portion of each bit line 14, the capping spacers 16B for capping the air gaps 20 are formed to be self-aligned.

Also, the air gap lower capping layer 25A not only hermetically seals the lower portions of the air gaps 20 but also prevents the bit lines 14 and the storage node contact plugs 26 from electrically shorting.

Figure 6A:
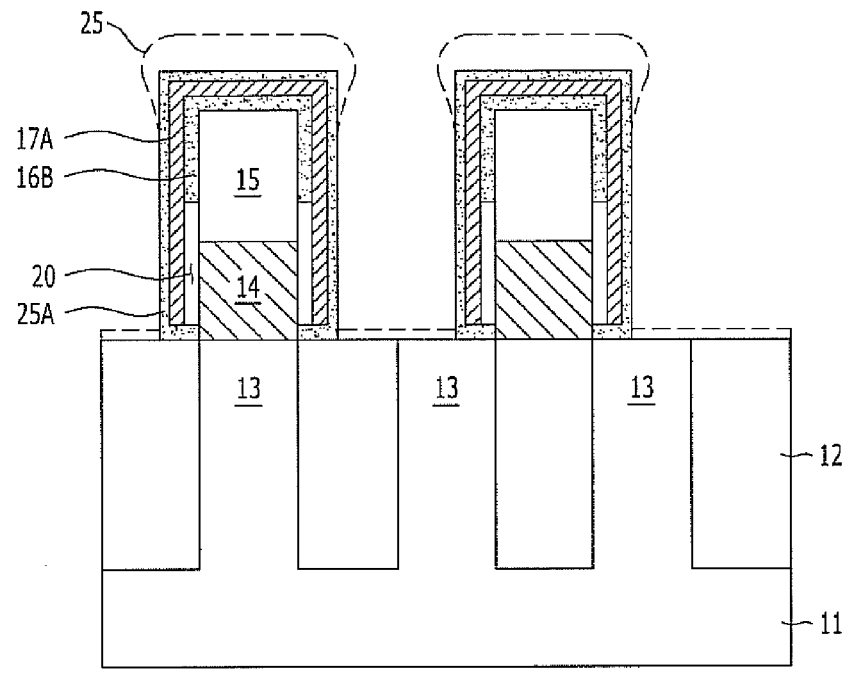
FIGS. 6A and 6B are cross-sectional views illustrating a method for fabricating the semiconductor device in accordance with an embodiment of the present invention.
Figure 6B:
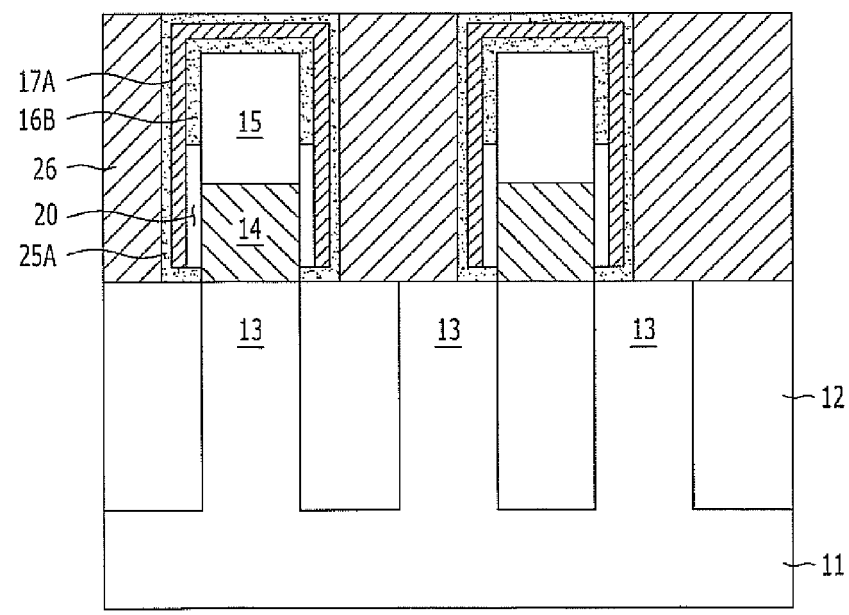

FIGS. 6A and 6B are cross-sectional views illustrating a method for fabricating the semiconductor device in accordance with an embodiment of the present invention. The fabrication process may be performed, which is similar to that of the above describved embodiment, except for the process of forming the air gap lower capping layer.

In other words, after the formation of the air gaps 20, as illustrated in FIG. 6A, an air gap lower capping layer 25 is formed over the profile of the semiconductor substrate 11 including the bit line structures where the air gaps 20 are formed. The air gap lower capping layer 25 may be an insulation layer, such as an oxide layer and a nitride layer. The air gap lower capping layer 23 may be formed through a Physical Vapor Deposition (PVD) process or a Plasma Enhanced Chemical Vapor Deposition (PECVD) process, which is known as a process having poor step coverage. Through the process, the upper portions of the air gap lower capping layer 25 is deposited thick over upper edges of the bit line structures. As a result, a profile called overhang may be obtained.

Subsequently, the air gap lower capping layer 25 is selectively etched. As a result, the surface of the semiconductor substrate 11 between the bit line structures is exposed. An etch-back process may be performed to remove the air gap lower capping layer 25 from the surface of the semiconductor substrate 11. After the etch-back process, an air gap lower capping layer 25A that covers the spacers 17A is formed. The air gap lower capping layer 25A remains in the upper portion and both sidewalls of each bit line structure. During the etch-back process, the spacers 17A are not exposed in the upper portions of the hard mask layer patterns 15.

The air gap lower capping layer 25A hermetically seals the lower portions of the air gaps 20. When storage node contact plugs are formed, the air gap lower capping layer 25A prevents the storage node contact plugs and the bit lines 14 from electrically shorting.

Referring to FIG. 6B, a conductive layer (not shown) is formed over the air gap lower capping layer 25A. As a result, the conductive layer is planarized. The planarization of the conductive layer stops at the air gap lower capping layer 25A. As a result, storage node contact plugs 26 are formed. The storage node contact plugs 26 may include a second conductive layer formed of a polysilicon doped with an impurity, a metal, a metal nitride, or a metal silicide. The storage node contact plugs 26 may be formed of any one among the named materials, or a stacked structure including two or more of the named materials.

Figure 7:
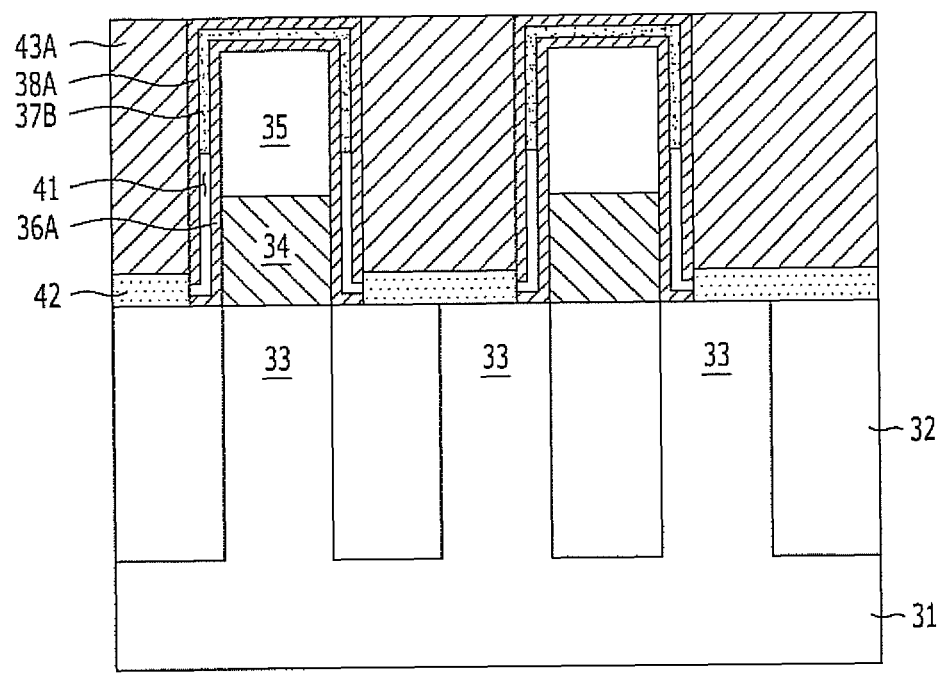
FIG. 7 is a cross-sectional view illustrating a semiconductor device in accordance with an embodiment of the present invention.

FIG. 7 is a cross-sectional view illustrating a semiconductor device in accordance with an embodiment of the present invention.

Referring to FIG. 7, a plurality of bit line structures are formed over a semiconductor substrate 31. Each of the bit line structures includes a bit line 34 and a hard mask layer pattern 35 stacked therein. The bit lines 34 may include a conductive material, such as a polysilicon, a metal, a metal nitride, and a metal silicide. The bit lines 34 may be formed of any one of the named conductive materials, or a stacked structure including two or more of the named conductive materials. The bit lines 34 may be of a type of lines stretched in any one direction. Although not illustrated in the drawing, a lower structure and an inter-layer dielectric layer may be further formed over the semiconductor substrate 31. The lower structure may include a conductive material, such as a polysilicon, a metal, a metal nitride, and a metal silicide. The inter-layer dielectric layer may include a silicon oxide and a silicon nitride. The inter-layer dielectric layer may cover the lower structure. The lower structure may be a plug penetrating through the inter-layer dielectric layer. The lower structure may be formed under the bit lines 34. The lower structure may be exposed between the bit lines 34. For example, an isolation layer 32 and active regions 33 may be formed under the bit lines 34. Also, although not illustrated in the drawing, gate structures such as buried gates may be formed. The bit lines 34 may be regularly disposed with a uniform space between them over the semiconductor substrate 31.

Storage node contact plugs 43A are formed between the multiple bit lines 34. The storage node contact plugs 43A may include a conductive material, such as a polysilicon, a metal, a metal nitride, and a metal silicide. The storage node contact plugs 43A may be formed of any one among the named conductive materials, or a stacked structure including two or more of the conductive materials.

Spacers including first and second spacers 36A and 38A are formed between the bit lines 34 and the storage node contact plugs 43A. The first and second spacers 36A and 38A may include an insulation layer. The first and second spacers 36A and 38A may be formed of a material having a low dielectric constant in order to decrease the parasitic capacitance between the bit line 34 and the storage node contact plug 43A. The first and second spacers 36A and 38A may include a nitride, such as a silicon nitride ($Si_3N_4$).

Air gaps 41 are formed between the first spacers 36A and the second spacers 38A. Capping spacers 37B are formed in the upper portions of the air gaps 41. The capping spacers 37B may have an isolated shape that can cover the upper sidewalls and upper portions of the hard mask layer patterns 35. The capping spacers 37B may be formed of a material that has a different dielectric constant from the first and second spacers 36A and 38A. The capping spacers 37B have a height that does not affect the parasitic capacitance between the bit line 34 and the storage node contact plug 43A. The air gaps 41 may be formed by removing a portion of each capping spacer 37B. The capping spacers 37B cover the upper portions of the air gaps 41.

An air gap lower capping layer 42 is formed under the storage node contact plugs 43A to hermetically seal the lower portions of the air gaps 41. The air gap lower capping layer 42 may be a silicon layer. The air gap lower capping layer 42 may be formed through a Selective Epitaxial Growth process.

As describe above, spacers having the air gaps 41 between the bit lines 34 and the storage node contact plugs 43A are formed. The lower portions of the air gaps 41 are hermetically sealed by the air gap lower capping layer 42. The air gaps 41 reduce the parasitic capacitance between the bit line 34 and the storage node contact plug 43A. Since the air gap 41 has a dielectric constant of '1', the air gap 41 may remarkably reduce the parasitic capacitance between the bit line 34 and the storage node contact plug 43A.

In accordance with the embodiment of the present invention, it does not have to additionally form a capping layer for hermetically sealing the air gaps 41. In other words, since the air gaps 41 are formed by removing a portion of each capping spacer 37A from the lower portion of each bit line 34, the capping spacers 37B for covering the air gaps 41 are formed to be self-aligned.

Also, the air gap lower capping layer 42 not only hermetically seals the lower portions of the air gaps 41 but also prevents the bit lines 34 and the storage node contact plugs 43A from shorting.

FIGS. 8A to 8F are cross-sectional views illustrating a method for fabricating the semiconductor device in accordance with an embodiment of the present invention.

Figure 8A:
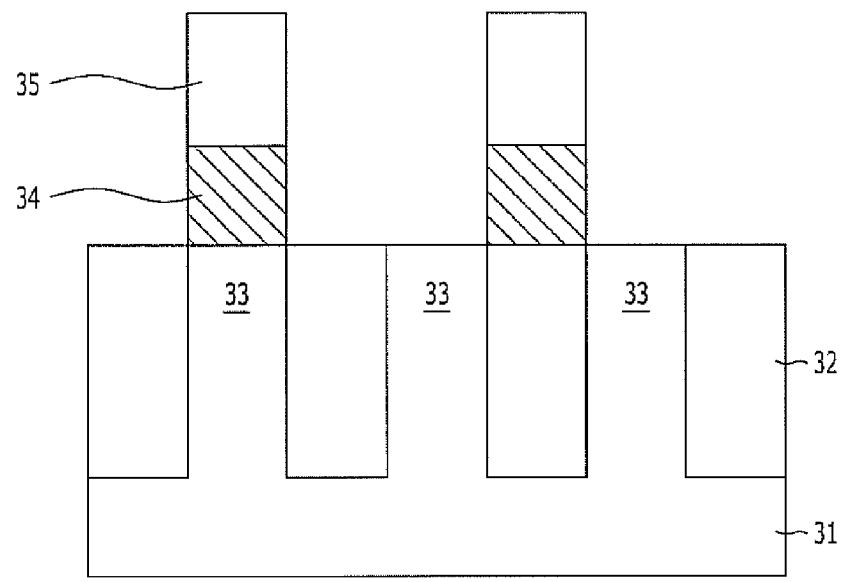
FIGS. 8A to 8F are cross-sectional views illustrating a method for fabricating the semiconductor device in accordance with an embodiment of the present invention.

Referring to FIG. 8A, the isolation layer 32 is formed over the semiconductor substrate 31. The isolation layer 32 is formed through a Shallow Trench Isolation (STI) process. The isolation layer 32 defines a plurality of active regions 33. Although not illustrated in the drawing, a process of forming buried gates BG may be performed after the isolation layer 32 is formed. The buried gates are formed through a process well known to people skilled in the art. The active regions 33 may include active regions to be coupled with the bit lines 34 and other active regions to be coupled with the storage node contact plugs 43A.

Subsequently, bit line structures where the bit lines 34 and the hard mask layer patterns 35 are stacked are formed on the surface of some active regions 33 among the multiple active regions 33. The bit line structures may have a type of lines that simultaneously penetrate the active regions 33 and the isolation layer 32. The hard mask layer patterns 35 may include silicon nitride. The bit lines 34 may include a conductive material, such as a semiconductor material doped with an impurity, a metal, a metal nitride, and/or a metal silicide. The bit lines 34 may be formed of any one among the named conductive materials, or a stacked structure including two or more of the conductive materials. For example, the bit lines 34 may be formed of one selected from the group consisting of a polysilicon, a tungsten, a titanium, an aluminum, a copper, a tantalum, a cobalt, a silicon, an iron, a nickel, and combinations thereof. In the embodiment of the present invention, the bit lines 34 may include a tungsten. The bit lines 34 may have a type of lines that are stretched in any one direction. The bit lines 34 may be regularly disposed with a uniform distance between them over the semiconductor substrate 31. The bit lines 34 may have a shape of lines formed on the surface of the isolation layer 32 while being formed on the surface of the active regions 33. Although not illustrated, plugs (not shown) may be further formed under the bit lines 34.

The bit lines 34 may be formed through the following method. A first conductive layer (not shown) is formed over the semiconductor substrate 31. Line-type hard mask layer patterns 35 are formed in a shape of lines that are regularly arrayed with a uniform distance from each other over the first conductive layer. The first conductive layer is etched using the hard mask layer patterns 35 as an etch barrier. As a result, the bit lines 34 are formed. The hard mask layer patterns 35 may be formed through a photolithography process.

Figure 8B:
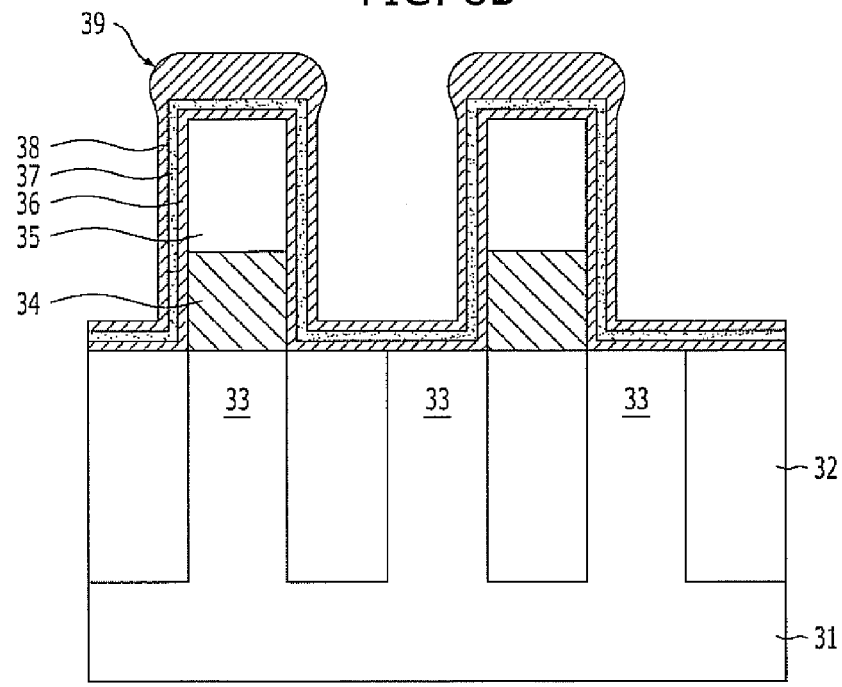

Referring to FIG. 8B, a spacer layer is formed over the profile of the substrate structure including the bit line structures. The spacer layer is to be used as bit line spacers. The spacer layer may be formed of a material selected from the group consisting of silicon, titanium nitride, silicon nitride, silicon oxide, and silicon oxynitride. The spacer layer may be formed of any one among the named materials or a stacked structure including two or more of the named materials.

The spacer layer may be formed by stacking a first spacer layer 36, a second spacer layer 37, and a third spacer layer 38. The first spacer layer 36 and the third spacer layer 38 may be formed of the same material. The second spacer layer 37 may be formed of a material having an etch selectivity to the first spacer layer 36 and the third spacer layer 38. For example, the first spacer layer 36 and the third spacer layer 38 may include silicon nitride, while the second spacer layer 37 may include silicon oxide. Therefore, the spacer layer may have a structure of nitride-oxide-nitride (NON). The silicon oxide may be deposited through a Chemical Vapor Deposition (CVD) process, and a method of oxidizing a portion of the silicon nitride may be used. The third spacer layer 38 may be formed through a Physical Vapor Deposition (PVD) process or a Plasma Enhanced Chemical Vapor Deposition (PECVD) process, which are known as a process having poor step coverage. Through the process, the upper portions of the third spacer layer 38 may be deposited thick (refer to reference numeral '39') over upper edges of the bit line structures. As a result, a profile called overhang may be obtained. According to another embodiment of the present invention, the third spacer layer 38 is deposited conformally. A fourth spacer layer (not shown) may be formed to be particularly thick over the bit line structures. For example, the fourth spacer layer may be formed through the PVD process or the PECVD process. The fourth spacer layer may include silicon nitride, or a material that may protect the upper portions of the bit line structures when silicon nitride and silicon oxide are etched out. For example, the fourth spacer layer may include metal.

According to another embodiment of the present invention, the first spacer layer 36 and the third spacer layer 38 may include silicon oxide ($SiO_2$), and the second spacer layer 37 may include titanium nitride (TiN). Therefore, the spacer layer may have a structure of oxide-TiN-oxide (OTO).

Figure 8C:
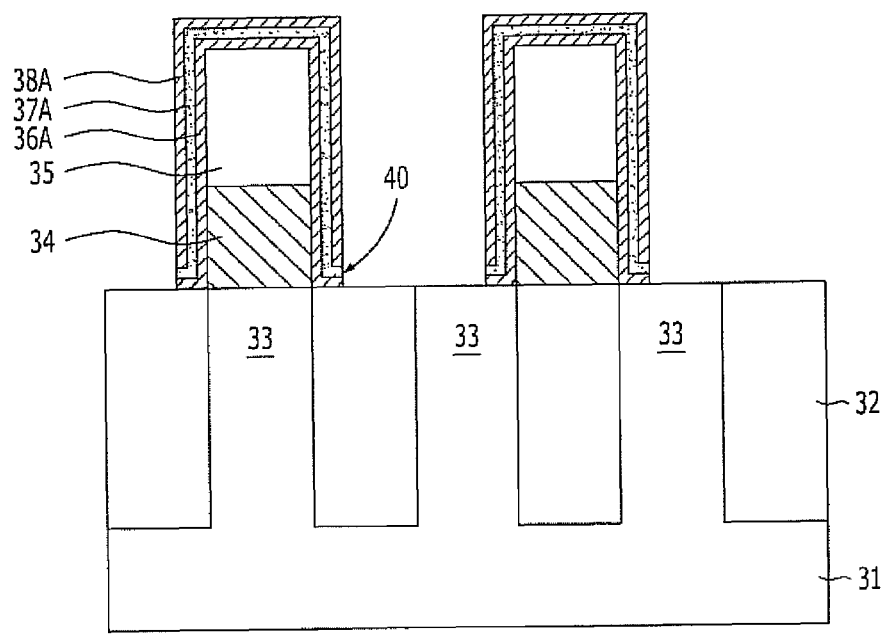

Referring to FIG. 8C, the surface of the semiconductor substrate 31 between the bit line structures is exposed by selectively removing the spacer layer. An etch-back process may be performed to remove the spacer layer from the surface of the semiconductor substrate 31. After the etch-back process, spacers including first spacers 36A, capping spacers 37A, and second spacers 38A are formed. The spacers may remain in the upper portion and both sidewalls of each bit line structure. During the etch-back process, the capping spacers 37A are not exposed in the upper portions of the hard mask layer patterns 35. The capping spacers 37A may be exposed (refer to reference numeral '40') in the lower sidewalls of the bit lines 34. The spacers have a structure of nitride-oxide-nitride (NON), and the silicon nitrides protect the silicon oxide from being exposed.

Figure 8D:
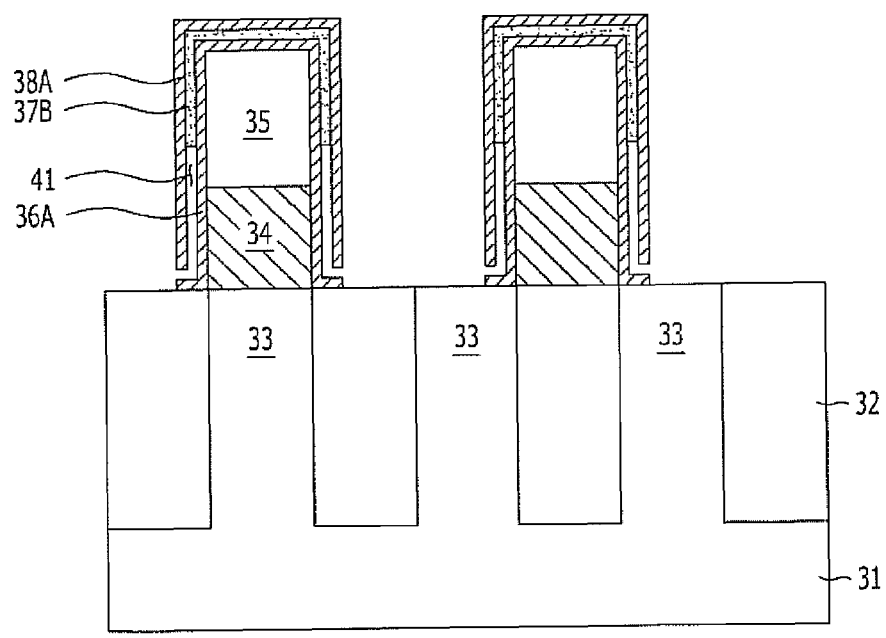

Referring to FIG. 8D, a portion of each capping spacer 37A of the spacers is selectively removed. When the first spacers 36A and the second spacers 38A are silicon nitrides while the capping spacers 37A include silicon oxide, the capping spacers 37A may be selectively removed through a wet-etch process. The wet-etch process may be performed using a chemical including hydrogen fluoride (HF). When the spacers have a structure of oxide-TIN-oxide (OTO), a chemical capable of selectively removing a titanium nitride is used. For example, a chemical including a mixed solution of sulfuric acid ($H_2SO_4$) and hydrogen peroxide ($H_2O_2$) may be used to selectively remove a titanium nitride.

Through a wet-etch process, the capping spacers 37A are etched from the lower portions of the bit lines 34. When the capping spacers 37A are removed, the first spacers 36A and the second spacers 38A are not etched due to their etch selectivities.

As described above, when a portion of each capping spacer 37A is etched from the lower sidewalls of the bit lines 34, spacers having air gaps 41 are formed. The spacers may cover the upper portion and both sidewalls of each hard mask layer pattern 35. Air gaps 41, which are empty space between the first spacers 36A and the second spacers 38A, are formed. After the formation of the air gaps 41, capping spacers 37B are formed in an isolated structure surrounding the upper portions and upper sidewalls of the hard mask layer patterns 35 between the first spacers 36A and the second spacers 38A. As a result, the spacers cover the capping spacers 37B under which the air gaps 41 are disposed. The capping spacers 37B have an isolated structure surrounding the upper portions and upper sidewalls of the hard mask layer patterns 35. The height of the air gaps 41 may be the same as or higher than the upper surface of the bit lines 34.

Figure 8E:
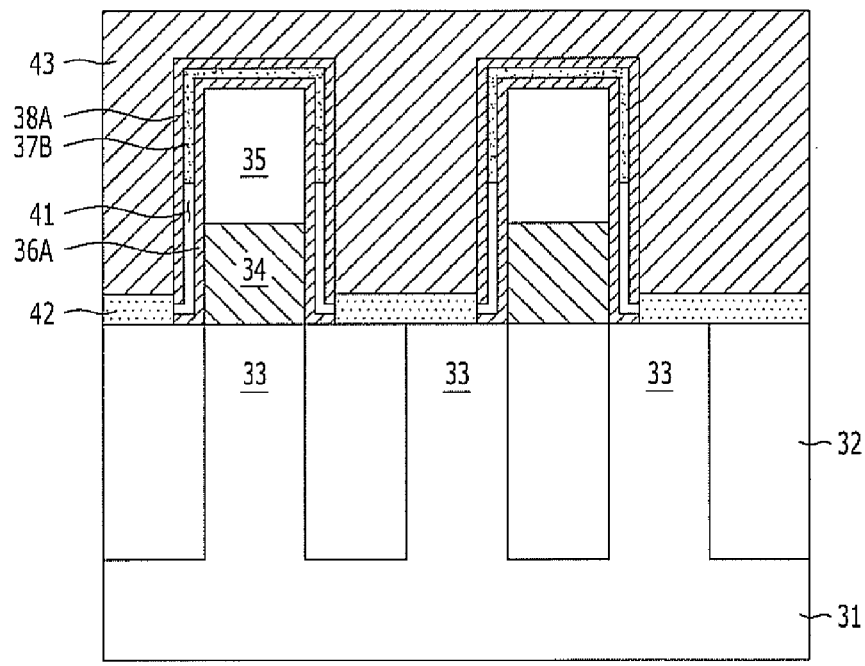

Referring to FIG. 8E, an air gap lower capping layer 42 is formed over the semiconductor substrate 31 between the bit line structures where the air gaps 41 are formed. The air gap lower capping layer 42 may be formed through a Selective Epitaxial Growth (SEG) process. For example, the air gap lower capping layer 42 may be a silicon layer. In other words, the air gap lower capping layer 42 may be formed by forming a silicon layer through the SEG process. The air gap lower capping layer 42 hermetically seals the lower portions of the air gaps 41. Also, when storage node contact plugs are formed later, the air gap lower capping layer 42 prevents the storage node contact plugs and the bit lines 34 from electrically shorting.

Subsequently, a conductive layer 43 is formed over the air gap lower capping layer 42. As a result, the space between the bit line structures may be gap-filled with the conductive layer 43. The conductive layer 43 may include a conductive material, such as a polysilicon doped with an impurity, a metal, a metal nitride, and a metal silicide. The conductive layer 43 may be formed of any one among the named materials, or a stacked structure including two or more of the named materials.

Figure 8F:
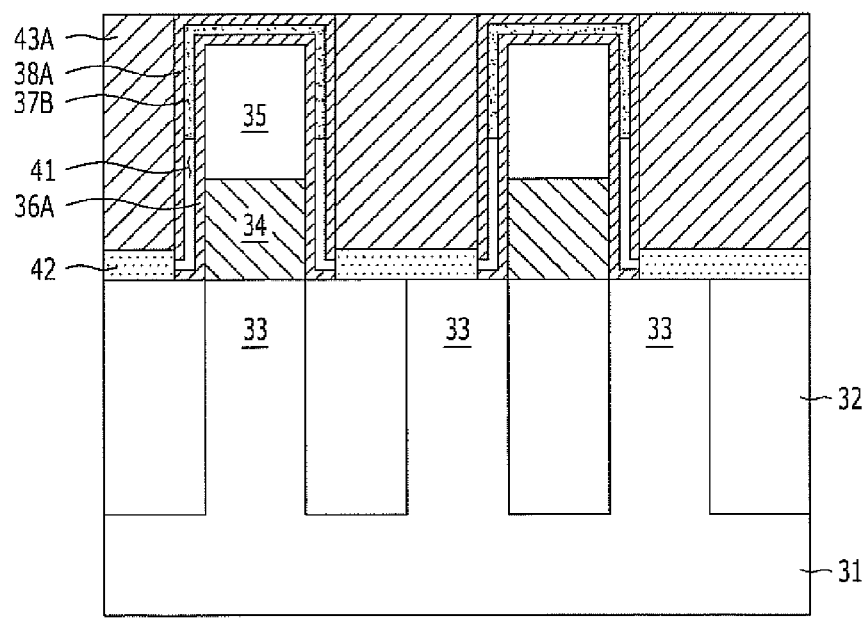

Referring to FIG. 8F, the conductive layer 43 is planarized. The planarization process stops at the spacers, particularly, at the second spacers 38A. As a result, storage node contact plugs 43A are formed.

As described above, when the storage node contact plugs 43A are formed, spacers having the air gaps 41 between the bit lines 34 and the storage node contact plugs 43A are formed. The air gap lower capping layer 42 hermetically seals the lower portions of the air gaps 41. The air gaps 41 may reduce the parasitic capacitance between the bit lines 34 and the storage node contact plugs 43A. Because the air gaps 41 have a dielectric constant of '1', the air gaps 41 may remarkably reduce the parasitic capacitance between the bit lines 34 and the storage node contact plugs 43A.

In accordance with the embodiment of the present invention, it does not have to additionally form a capping layer for hermetically sealing the air gaps 41. In other words, since the air gaps 41 are formed by removing a portion of each capping spacer 37A from the lower portion of each bit line 34, the capping spacers 37B for capping the air gaps 41 are formed to be self-aligned.

Also, the air gap lower capping layer 42 not only hermetically seals the lower portions of the air gaps 41 but also prevents the bit lines 34 and the storage node contact plugs 43A from shorting.

Figure 9:
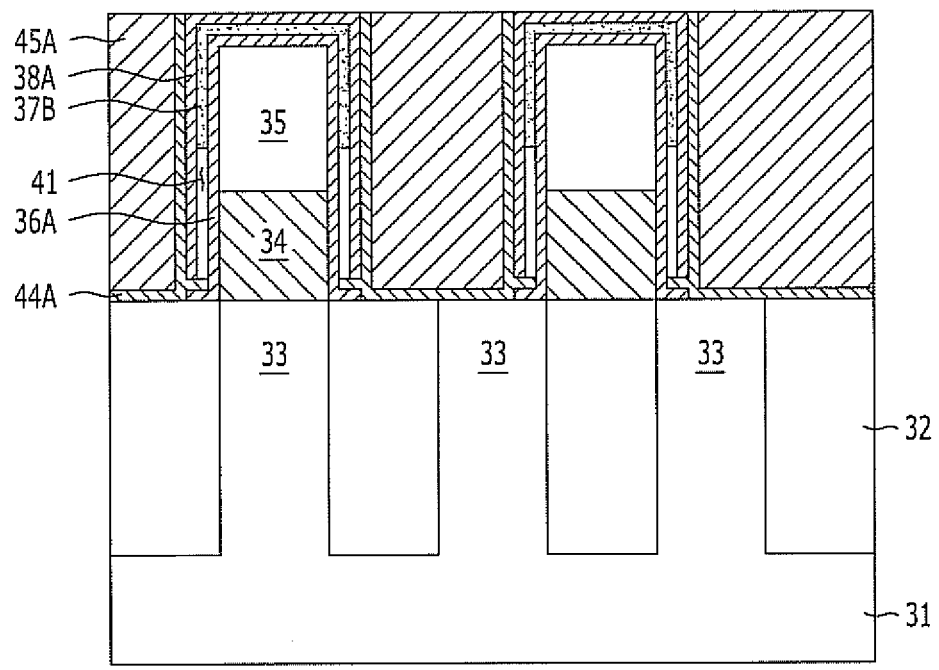
FIG. 9 is a cross-sectional view illustrating a semiconductor device in accordance with an embodiment of the present invention.

FIG. 9 is a cross-sectional view illustrating a semiconductor device in accordance with an embodiment of the present invention.

Referring to FIG. 9, a plurality of bit line structures are formed over a semiconductor substrate 31. Each of the bit line structures includes a bit line 34 and a hard mask layer pattern 35 stacked therein. The bit lines 34 may include a conductive material, such as a polysilicon, a metal, a metal nitride, and a metal silicide. The bit lines 34 may be formed of any one of the named conductive materials, or the bit lines 34 may be of a stacked structure where at least two of the named conductive materials are stacked. The bit lines 34 may be of a type of lines stretched in any one direction. Although not illustrated in the drawing, a lower structure and an inter-layer dielectric layer may be further formed over the semiconductor substrate 31. The lower structure may include a conductive material, such as a polysilicon, a metal, a metal nitride, and a metal silicide. The inter-layer dielectric layer may include a silicon oxide and a silicon nitride. The inter-layer dielectric layer may cover the lower structure, and the lower structure may be a plug penetrating through the inter-layer dielectric layer. The lower structure may be formed under the bit lines 34, and the lower structure may be exposed between the bit lines 34. For example, an isolation layer 32 between active regions 33 may be formed under the bit lines 34. Also, although not illustrated in the drawing, gate structures such as buried gates may be formed. The bit lines 34 may be regularly disposed with a uniform space between them over the semiconductor substrate 31.

Storage node contact plugs 45A are formed between the multiple bit lines 34. The storage node contact plugs 45A may include a conductive material, such as a polysilicon, a metal, a metal nitride, and a metal silicide. The storage node contact plugs 45A may be formed of any one among the named conductive materials, or a stacked structure including two or more of the conductive materials.

Spacers including first and second spacers 36A and 38A are formed between the bit lines 34 and the storage node contact plugs 45A. The first and second spacers 36A and 38A may include an insulation layer. The first and second spacers 36A and 38A may be formed of a material having a low dielectric constant in order to decrease the parasitic capacitance between the bit line 34 and the storage node contact plug 45A. The first and second spacers 36A and 38A may include a nitride, such as a silicon nitride ($Si_3N_4$).

Air gaps 41 are formed between the first spacers 36A and the second spacers 38A. Capping spacers 37B are formed in the upper portions of the air gaps 41. The capping spacers 37B may have an isolated shape which covers the upper sidewalls and upper portions of the hard mask layer patterns 35. The capping spacers 37B may be formed of a material that has a different dielectric constant from the first and second spacers 36A and 38A. The capping spacers 37B have a height that does not affect the parasitic capacitance between the bit lines 34 and the storage node contact plugs 45A. The air gaps 41 may be formed by removing a portion of each capping spacer 37B. The capping spacers 37B cap the upper portions of the air gaps 41.

An air gap lower capping layer 44A is formed on the sidewalls of the second spacers 38A to hermetically seal the lower portions of the air gaps 41. The air gap lower capping layer 44A may be a silicon layer.

As describe above, spacers having the air gaps 41 between the bit lines 34 and the storage node contact plugs 45A are formed. The lower portions of the air gaps 41 are hermetically sealed by the air gap lower capping layer 44A. The air gaps 41 reduce the parasitic capacitance between the bit line 34 and the storage node contact plug 45A. Because the air gaps 41 have a dielectric constant of '1', the air gaps 41 may remarkably reduce the parasitic capacitance between the bit lines 34 and the storage node contact plugs 45A.

In accordance with the embodiment of the present invention, it does not have to additionally form a capping layer for hermetically sealing the air gaps 41. In other words, since the air gaps 41 are formed by removing a portion of each capping spacer 37A from the lower portion of each bit line 34, the capping spacers 37B for capping the air gaps 41 are formed to be self-aligned.

Also, the air gap lower capping layer 44A not only hermetically seals the lower portions of the air gaps 41 but also prevents the bit lines 34 and the storage node contact plugs 45A from electrically shorting.

Figure 10A:
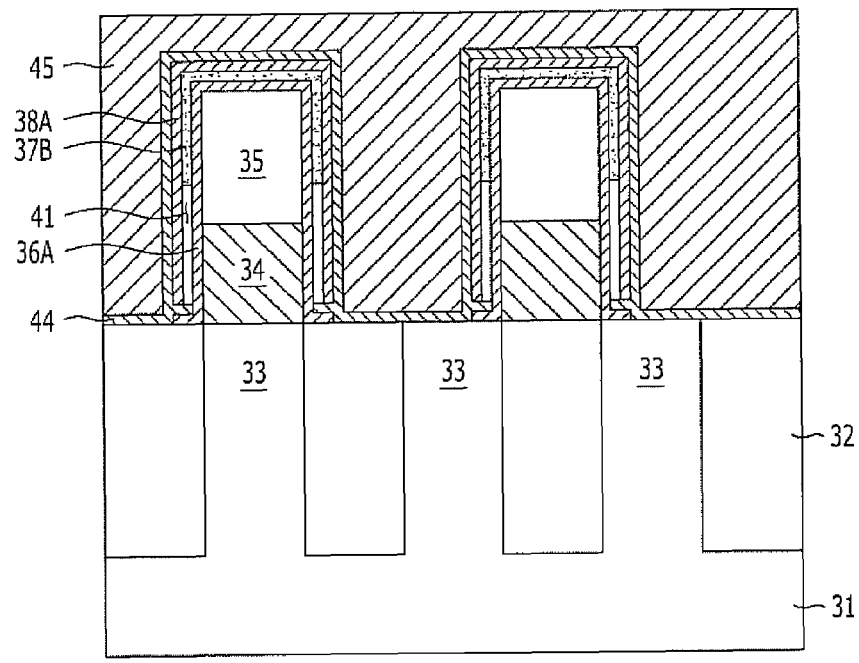
FIGS. 10A and 10B are cross-sectional views illustrating a method for fabricating the semiconductor device in accordance with an embodiment of the present invention.
Figure 10B:
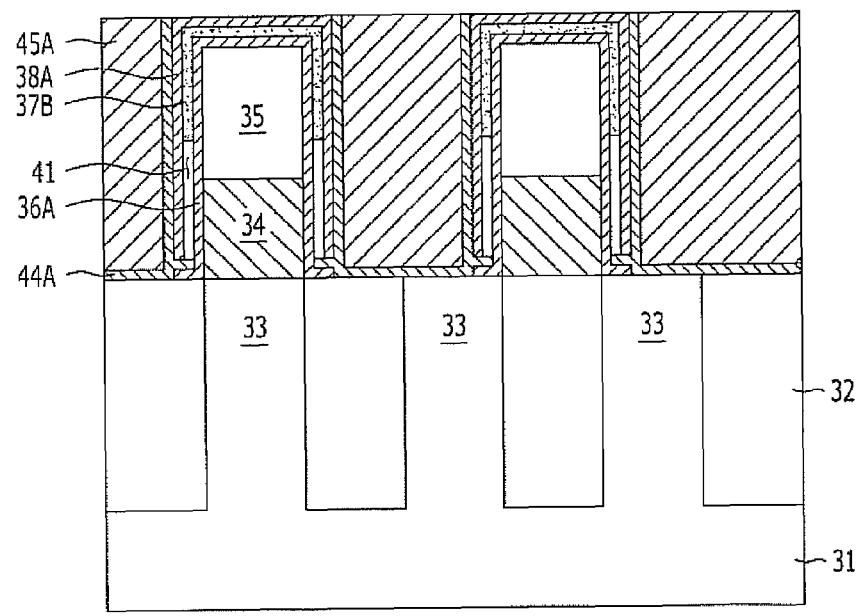

FIGS. 10A and 10B are cross-sectional views illustrating a method for fabricating the semiconductor device in accordance with an embodiment of the present invention. The fabrication process may be performed, which is similar to that of the above described embodiment, except for the process of forming the air gap lower capping layer.

In other words, after the formation of the air gaps 41, as illustrated in FIG. 10A, an air gap lower capping layer 44 is formed over the profile of the semiconductor substrate 31 including the bit line structures where the air gaps 41 are formed. The air gap lower capping layer 44 may be a polysilicon layer. The air gap lower capping layer 44 may be formed through a Low Pressure Chemical Vapor Deposition (LPCVD) process.

The air gap lower capping layer 44 hermetically seals the lower portions of the air gaps 41. When storage node contact plugs are formed, the air gap lower capping layer 44 prevents the storage node contact plugs and the bit lines 34 from electrically shorting.

Subsequently, a conductive layer 45 is formed over the air gap lower capping layer 44. As a result, the conductive layer 45 may gap-fill the space between the bit line structures. The conductive layer 45 may include a conductive layer formed of a polysilicon doped with an impurity, a metal, a metal nitride, and a metal silicide. The conductive layer may be formed of any one among the named materials, or a stacked structure containing two or more of the named materials.

Referring to FIG. 10B, the conductive layer 45 is planarized. The planarization of the conductive layer 45 and the air gap lower capping layer 44 stops at the surface of the second spacers 38A in the upper portions of the bit line structures. As a result, storage node contact plugs 45A are formed between the bit line structures. The air gap lower capping layer 44A is formed between the second spacers 38A and the storage node contact plugs 45A.

Figure 11:
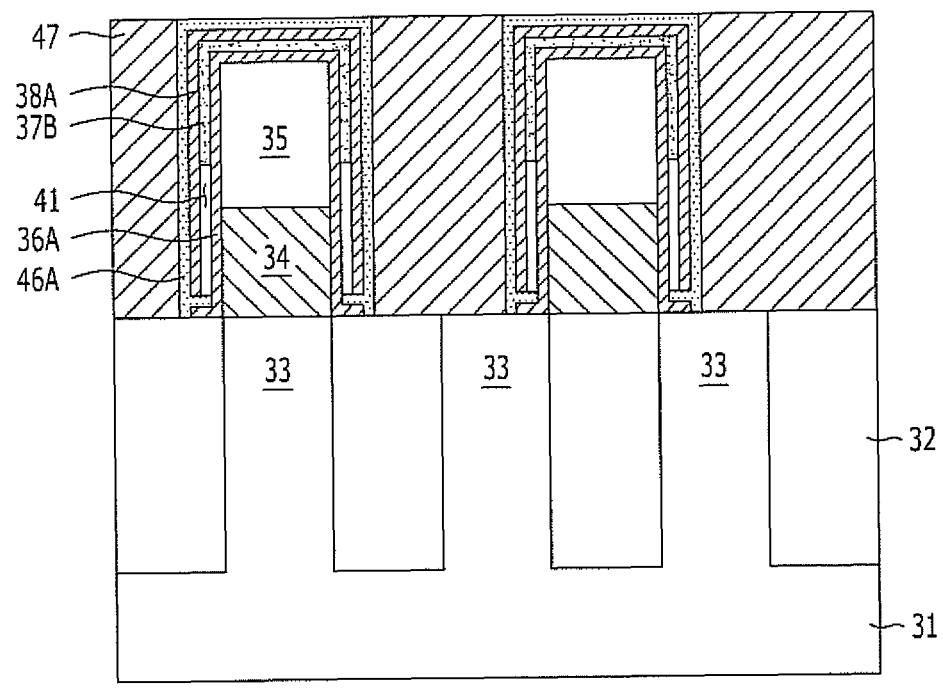
FIG. 11 is a cross-sectional view illustrating a semiconductor device in accordance with an embodiment of the present invention.

FIG. 11 is a cross-sectional view illustrating a semiconductor device in accordance with an embodiment of the present invention.

Referring to FIG. 11, a plurality of bit line structures are formed over a semiconductor substrate 31. Each of the bit line structures includes a bit line 34 and a hard mask layer pattern 35 stacked therein. The bit lines 34 may include a conductive material, such as a polysilicon, a metal, a metal nitride, and a metal silicide. The bit lines 34 may be formed of any one of the named conductive materials, or a stacked structure including two or more of the named conductive materials. The bit line 34 may be in a shape of line. Although not illustrated in the drawing, a lower structure and an inter-layer dielectric layer may be further formed over the semiconductor substrate 31. The lower structure may include a conductive material, such as a polysilicon, a metal, a metal nitride, and a metal silicide. The inter-layer dielectric layer may include a silicon oxide and a silicon nitride. The inter-layer dielectric layer may cover the lower structure, and the lower structure may be a plug penetrating through the inter-layer dielectric layer. The lower structure may be formed under the bit lines 34, and the lower structure may be exposed between the bit lines 34. For example, an isolation layer 32 and active regions 33 may be formed under the bit lines 34. Also, although not illustrated in the drawing, gate structures such as buried gates may be formed. The bit lines 34 may be regularly disposed with a uniform space between them over the semiconductor substrate 31.

Storage node contact plugs 47 are formed between the multiple bit lines 34. The storage node contact plugs 47 may include a conductive material, such as a polysilicon, a metal, a metal nitride, and a metal silicide. The storage node contact plugs 47 may be formed of any one among the named conductive materials, or a stacked structure including two or more of the conductive materials.

Spacers including first and second spacers 36A and 38A are formed between the bit lines 34 and the storage node contact plugs 47. The first and second spacers 36A and 38A may include an insulation layer. The first and second spacers 36A and 38A may be formed of a material having a low dielectric constant in order to decrease the parasitic capacitance between the bit line 34 and the storage node contact plug 47. The first and second spacers 36A and 38A may include a nitride, such as a silicon nitride ($Si_3N_4$).

Air gaps 41 are formed between the first spacers 36A and the second spacers 38A, and capping spacers 37B are formed in the upper portions of the air gaps 41. The capping spacers 37B may have an isolated shape that covers the upper sidewalls and upper portions of the hard mask layer patterns 35. The capping spacers 37B may be formed of a material that has a different dielectric constant from the first and second spacers 36A and 38A. The capping spacers 37B have a height that does not affect the parasitic capacitance between the bit lines 34 and the storage node contact plugs 47. The air gaps 41 may be formed by removing a portion of each capping spacer 37B. The capping spacers 37B cover the upper portions of the air gaps 41.

An air gap lower capping layer 46A is formed on the sidewalls of the second spacers 38A to hermetically seal the lower portions of the air gaps 41. The air gap lower capping layer 46A may be an insulation layer, such as an oxide layer and a nitride layer. The air gap lower capping layer 46A covers the upper surface and both sidewalls of each bit line structure in the upper portion of the second spacers 38A.

As describe above, spacers having the air gaps 41 between the bit lines 34 and the storage node contact plugs 47 are formed. The lower portions of the air gaps 41 are hermetically sealed by the air gap lower capping layer 46A. The air gaps 41 may reduce the parasitic capacitance between the bit lines 34 and the storage node contact plugs 47, because the air gaps 41 have a dielectric constant of '1'.

In accordance with the embodiment of the present invention, it is not required to additionally form a capping layer for hermetically sealing the air gaps 41. In other words, since the air gaps 41 are formed by removing a portion of each capping spacer 37A from the lower portion of each bit line 34, the capping spacers 37B for capping the air gaps 41 are formed to be self-aligned.

Also, the air gap lower capping layer 46A not only hermetically seals the lower portions of the air gaps 41 but also prevents the bit lines 34 and the storage node contact plugs 47 from electrically shorting.

Figure 12A:
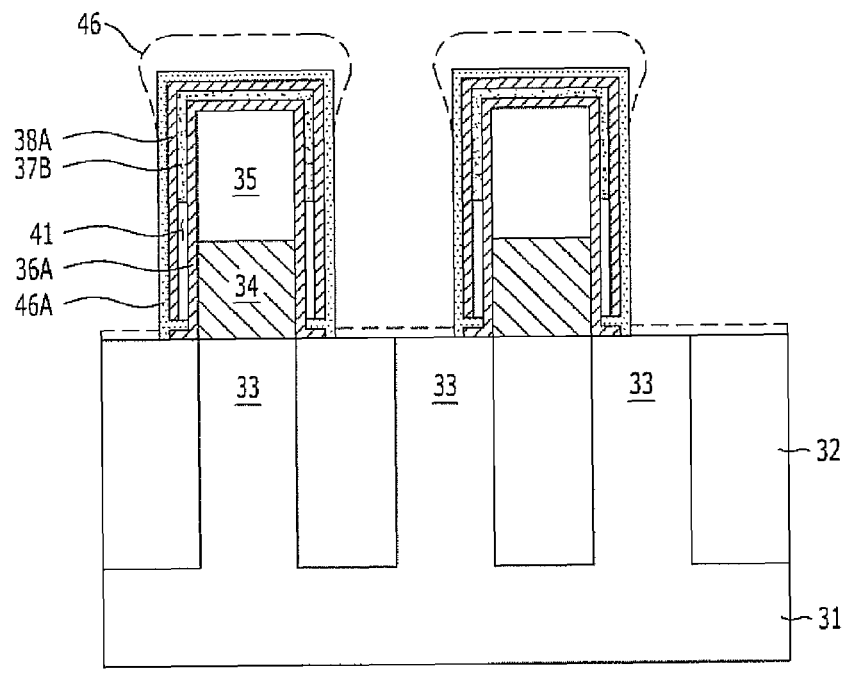
FIGS. 12A and 12B are cross-sectional views illustrating a method for fabricating the semiconductor device in accordance with an embodiment of the present invention.
Figure 12B:
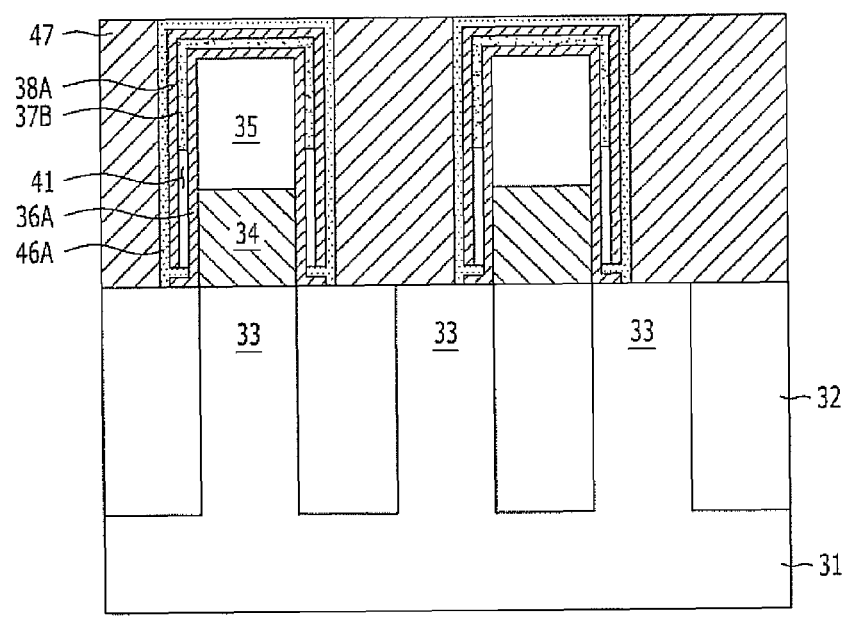

FIGS. 12A and 12B are cross-sectional views illustrating a method for fabricating the semiconductor device in accordance with an embodiment of the present invention. The fabrication process may be performed, which is similar to that of the above described embodiment, except for the process of forming the air gap lower capping layer.

In other words, after the formation of the air gaps 41, as illustrated in FIG. 12A, an air gap lower capping layer 46 is formed over the profile of the semiconductor substrate 31 including the bit line structures where the air gaps 41 are formed. The air gap lower capping layer 46 may be an insulation layer, such as an oxide layer and a nitride layer. The air gap lower capping layer 46 may be formed through a Physical Vapor Deposition (PVD) process or a Plasma Enhanced Chemical Vapor Deposition (PECVD) process, which are known as a process having poor step coverage. Through the process, the air gap lower capping layer 46 is deposited thick in the upper portions and upper edges of the bit line structures. As a result, a profile called overhang may be obtained.

Subsequently, the air gap lower capping layer 46 is selectively etched. As a result, the surface of the semiconductor substrate 31 between the bit line structures is exposed. An etch-back process may be performed to remove the air gap lower capping layer 46 from the surface of the semiconductor substrate 31. After the etch-back process, an air gap lower capping layer 46A that covers the second spacers 38A is formed. The air gap lower capping layer 46A remains on the upper portion and both sidewalls of each bit line structure. During the etch-back process, the second spacers 38A are not exposed in the upper portions of the hard mask layer patterns 35.

The air gap lower capping layer 46A hermetically seals the lower portions of the air gaps 41. When storage node contact plugs are formed, the air gap lower capping layer 46A may prevent the storage node contact plugs and the bit lines 34 from electrically shorting.

Referring to FIG. 12B, a conductive layer (not shown) is formed over the profile of the substrate structure including the air gap lower capping layer 46A. As a result, the conductive layer is planarized. The planarization of the conductive layer stops at the air gap lower capping layer 46A. As a result, storage node contact plugs 47 are formed. The storage node contact plugs 47 may include a conductive layer formed of a polysilicon doped with an impurity, a metal, a metal nitride, or a metal silicide. The storage node contact plugs 47 may be formed of any one among the named materials, or a stacked structure containing two or more of the named materials.

Figure 13:
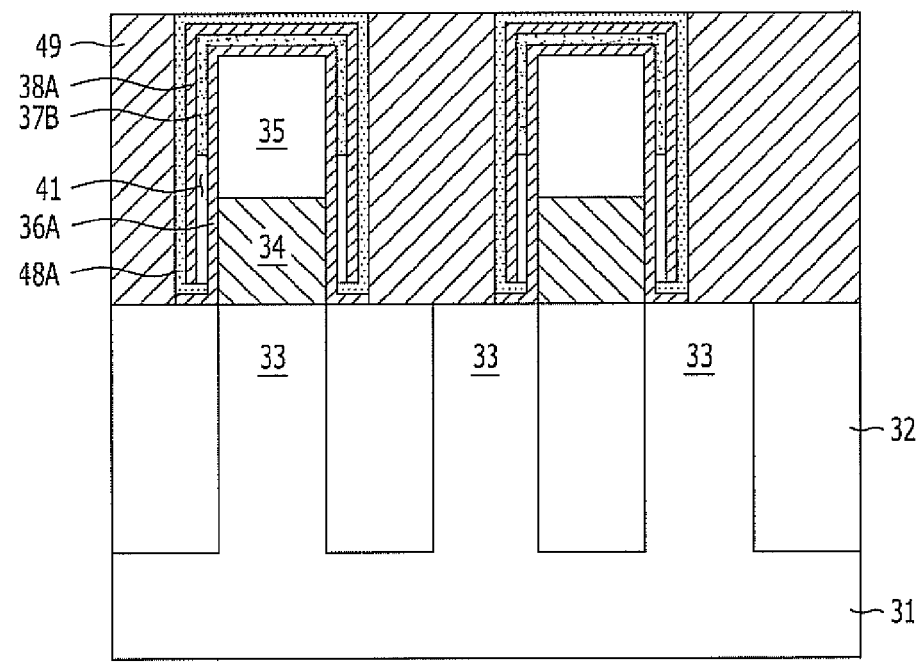
FIG. 13 is a cross-sectional view illustrating a semiconductor device in accordance with an embodiment of the present invention.

FIG. 13 is a cross-sectional view illustrating a semiconductor device in accordance with an embodiment of the present invention.

Referring to FIG. 13, a plurality of bit line structures are formed over a semiconductor substrate 31. Each of the bit line structures includes a bit line 34 and a hard mask layer pattern 35 stacked therein. The bit lines 34 may include a conductive material, such as a polysilicon, a metal, a metal nitride, and a metal silicide. The bit lines 34 may be formed of any one of the named conductive materials, or a stacked structure including two or more of the named conductive materials. The bit line 34 may be in a form of line. Although not illustrated in the drawing, a lower structure and an inter-layer dielectric layer may be further formed over the semiconductor substrate 31. The lower structure may include a conductive material, such as a polysilicon, a metal, a metal nitride, and a metal silicide. The inter-layer dielectric layer may include a silicon oxide and a silicon nitride. The inter-layer dielectric layer may cover the lower structure. The lower structure may be a plug penetrating through the inter-layer dielectric layer. The lower structure may be formed under the bit lines 34. The lower structure may be exposed between the bit lines 34. For example, an isolation layer 32 and active regions 33 may be formed under the bit lines 34. Also, although not illustrated in the drawing, gate structures such as buried gates may be formed. The bit lines 34 may be regularly disposed with a uniform space between them over the semiconductor substrate 31.

Storage node contact plugs 49 are formed between the multiple bit lines 34. The storage node contact plugs 49 may include a conductive material, such as a polysilicon, a metal, a metal nitride, and a metal silicide. The storage node contact plugs 49 may be formed of any one among the named conductive materials, or a stacked structure including two or more of the conductive materials.

Spacers including first and second spacers 36A and 38A are formed between the bit lines 34 and the storage node contact plugs 49. The first and second spacers 36A and 38A may include an insulation layer. The first and second spacers 36A and 38A may be formed of a material having a low dielectric constant in order to decrease the parasitic capacitance between the bit line 34 and the storage node contact plug 49. The first and second spacers 36A and 38A may include a nitride, such as a silicon nitride ($Si_3N_4$).

Air gaps 41 are formed between the first spacers 36A and the second spacers 38A, and capping spacers 37B are formed in the upper portions of the air gaps 41. The capping spacers 37B may have an isolated shape that covers the upper sidewalls and upper portions of the hard mask layer patterns 35. The capping spacers 37B may be formed of a material that has a different dielectric constant from the first and second spacers 36A and 38A. The capping spacers 37B have a height that does not affect the parasitic capacitance between the bit line 34 and the storage node contact plug 49. The air gaps 41 may be formed by removing a portion of each capping spacer 37B. The capping spacers 37B cover the upper portions of the air gaps 41.

An air gap lower capping layer 48A is formed on the upper surface and both sidewalls of each bit line structure including the second spacers 38A to hermetically seal the lower portions of the air gaps 41. The air gap lower capping layer 48A may be an insulation layer, such as an oxide layer and a nitride layer.

As describe above, spacers having the air gaps 41 between the bit lines 34 and the storage node contact plugs 49 are formed. The lower portions of the air gaps 41 are hermetically sealed by the air gap lower capping layer 48A. The air gaps 41 may reduce the parasitic capacitance between the bit line 34 and the storage node contact plug 49 because the air gaps 41 have a dielectric constant of '1'.

In accordance with an embodiment of the present invention, it does not have to additionally form a capping layer for hermetically sealing the air gaps 41. In other words, since the air gaps 41 are formed by removing a portion of each capping spacer 37A from the lower portion of each bit line 34, the capping spacers 37B for capping the air gaps 41 are formed to be self-aligned.

Also, the air gap lower capping layer 48A not only hermetically seals the lower portions of the air gaps 41 but also prevents the bit lines 34 and the storage node contact plugs 49 from electrically shorting.

FIGS. 14A to 14G are cross-sectional views illustrating a method for fabricating the semiconductor device in accordance with an embodiment of the present invention.

Figure 14A:
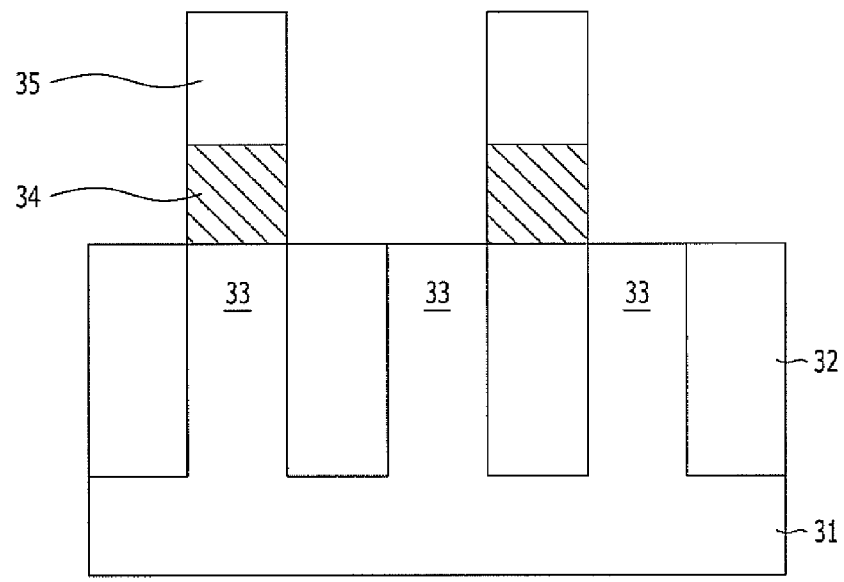
FIGS. 14A to 14G are cross-sectional views illustrating a method for fabricating the semiconductor device in accordance with an embodiment of the present invention.

Referring to FIG. 14A, the isolation layer 32 is formed over the semiconductor substrate 31. The isolation layer 32 is formed through a Shallow Trench Isolation (STI) process. The isolation layer 32 defines a plurality of active regions 33. Although not illustrated in the drawing, a process of forming buried gates BG may be performed after the isolation layer 32 is formed. The buried gates are formed through a process known to people skilled in the art. The active regions 33 may include active regions to be coupled with the bit lines and other active regions to be coupled with the storage node contact plugs.

Subsequently, bit line structures where the bit lines 34 and the hard mask layer patterns 35 are stacked are formed on the surface of some active regions 33 among the multiple active regions 33. The bit line structures may have a form of lines that simultaneously penetrate the active regions 33 and the isolation layer 32. The hard mask layer patterns 35 may include silicon nitride. The bit lines 34 may include a conductive material, such as a semiconductor material doped with an impurity, a metal, a metal JO nitride, and/or a metal silicide. The bit lines 34 may be formed of any one among the named conductive materials, or a stacked structure containing two or more of the conductive materials. For example, the bit lines 34 may be formed of one selected from the group consisting of a polysilicon, a tungsten, a titanium, an aluminum, a copper, a tantalum, a cobalt, a silicon, an iron, a nickel, and combinations thereof. In this embodiment of the present invention, the bit lines 34 may include a tungsten. The bit lines 34 may have a form of lines that are stretched in any one direction. The bit lines 34 may be regularly disposed with a uniform distance between them over the semiconductor substrate 31. The bit lines 34 may have a shape of lines formed on the surface of the isolation layer 32 while being formed on the surface of the active regions 33. Although not illustrated, plugs (not shown) may be further formed under the bit lines 34.

The bit lines 34 may be formed through the following method. A first conductive layer (not shown) is formed over the semiconductor substrate 31. Line-type hard mask layer patterns 35 are formed in a shape of lines that are regularly arrayed with a uniform distance from each other over the first conductive layer. The first conductive layer is etched using the hard mask layer patterns 35 as an etch barrier. As a result, the bit lines 34 are formed. The hard mask layer patterns 35 may be formed through a photolithography process.

Figure 14B:
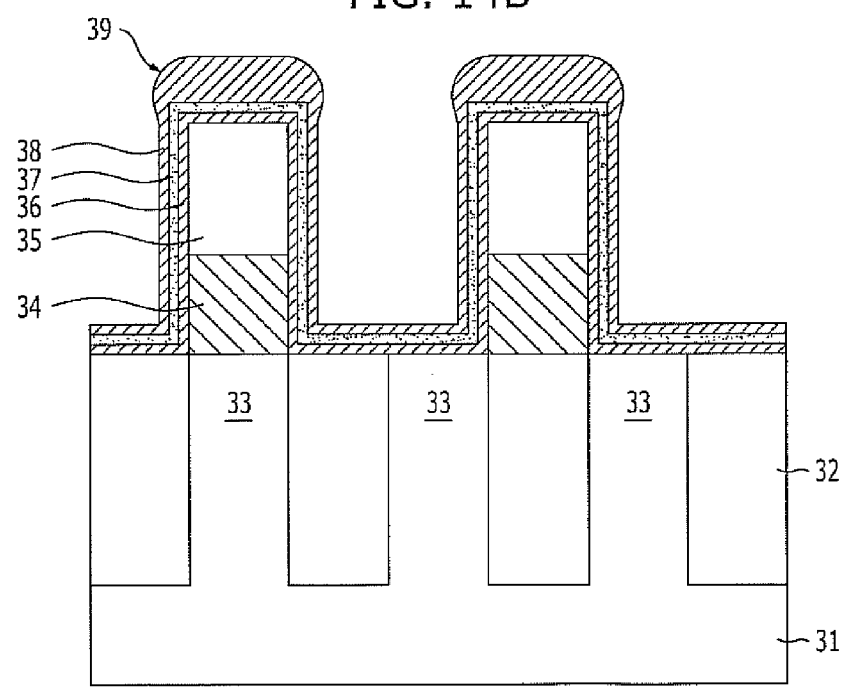

Referring to FIG. 14B, a spacer layer is formed over the profile of the substrate structure including the bit line structures. The spacer layer is to be used as bit line spacers. The spacer layer may be formed of a material selected from the group consisting of a silicon, a titanium nitride, a silicon nitride, a silicon oxide, and a silicon oxynitride. The spacer layer may be formed of any one among the named materials or a stacked structure containing two or more of the named materials.

The spacer layer may be formed by stacking a first spacer layer 36, a second spacer layer 37, and a third spacer layer 38. The first spacer layer 36 and the third spacer layer 38 may be formed of the same material. The second spacer layer 37 may be formed of a material having an etch selectivity to the first spacer layer 36 and the third spacer layer 38. For example, the first spacer layer 36 and the third spacer layer 38 may include silicon nitride, while the second spacer layer 37 may include silicon oxide. Therefore, the spacer layer may have a structure of nitride-oxide-nitride (NON). The silicon oxide may be deposited through a Chemical Vapor Deposition (CVD) process, and a method of oxidizing a portion of the silicon nitride may be used. The third spacer layer 38 may be formed through a Physical Vapor Deposition (PVD) process or a Plasma Enhanced Chemical Vapor Deposition (PECVD) process, which are known as a process having poor step coverage. Through the process, the upper portions of the third spacer layer 38 may be deposited thick (refer to reference numeral '39') over upper edges of the bit line structures. As a result, a profile called overhang may be obtained. According to another embodiment of the present invention, the third spacer layer 38 is deposited conformally, and then a fourth spacer layer (not shown) may be formed to be particularly thick over the bit line structures. For example, the fourth spacer layer may be formed through the PVD process or the PECVD process. The fourth spacer layer may include a silicon nitride, or a material that may protect the upper portions of the bit line structures when silicon nitride and silicon oxide are etched out. For example, the fourth spacer layer may include a metal. According to another embodiment of the present invention, the first spacer layer 36 and the third spacer layer 38 may include a silicon oxide ($SiO_2$) The second spacer layer 37 may include a titanium nitride (TIN). Therefore, the spacer layer may have a structure of oxide-TiN-oxide (OTO).

Figure 14C:
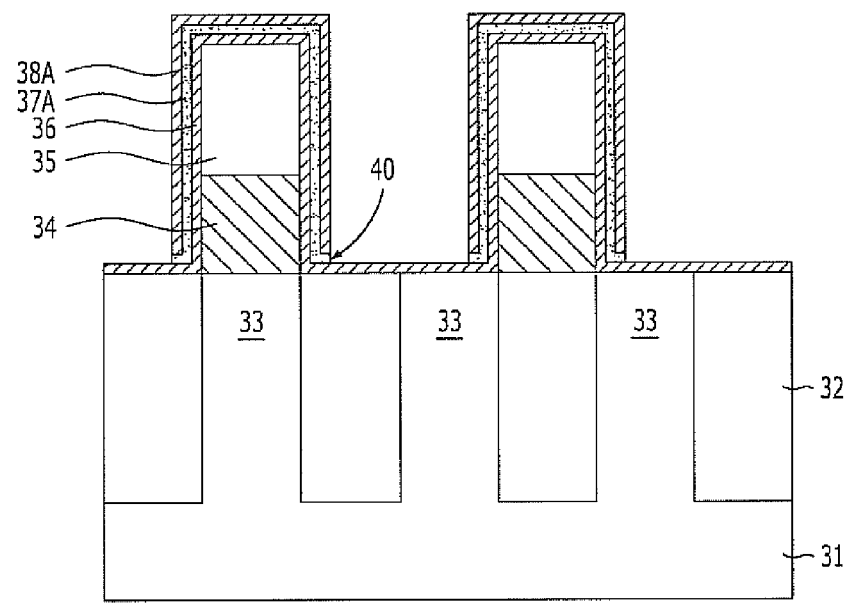

Referring to FIG. 14C, the third spacer layer 38 and the second spacer layer 37 are selectively removed. An etch-back process may be performed to remove the third spacer layer 38 and the second spacer layer 37. After the etch-back process, the first spacer layer 36 remains on the surface of the semiconductor substrate 31. Capping spacers 37A and second spacers 38A are formed in the upper portions and both sidewalls of the bit line structures. During the etch-back process, the capping spacers 37A are not exposed in the upper portions of the hard mask layer patterns 35. The capping spacers 37A may be exposed (refer to reference numeral '40') in the lower sidewalls of the bit lines 34.

Figure 14D:
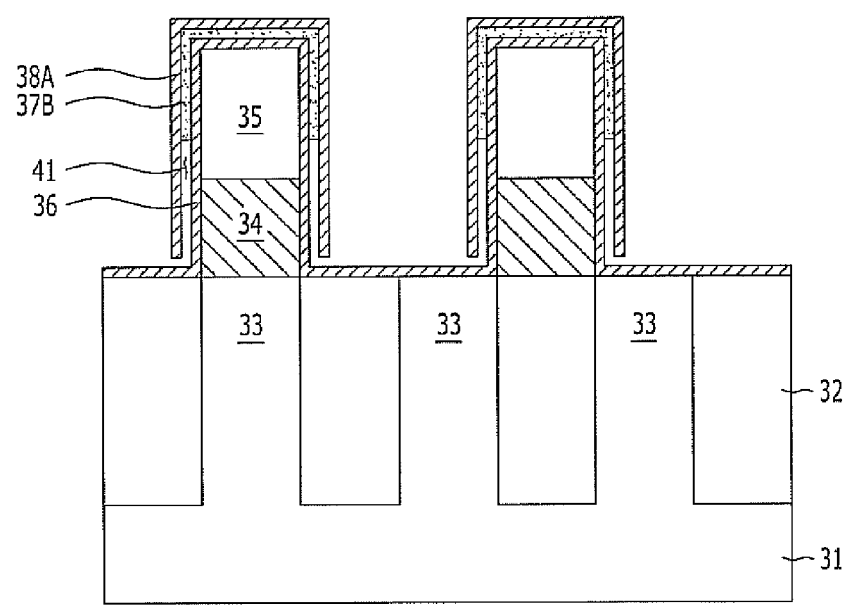

Referring to FIG. 14D, a portion of each capping spacer 37A of the spacers is selectively removed. When the first spacer layer 36 and the second spacers 38A are silicon nitrides while the capping spacers 37A include a silicon oxide, the capping spacers 37A may be selectively removed through a wet-etch process. The wet-etch process may be performed using a chemical including hydrogen fluoride (HF). Because the spacers have a structure of oxide-TiN-oxide (OTO), a chemical which is capable of selectively removing a titanium nitride is used. For example, a chemical including a mixed solution of sulfuric acid ($H_2SO_4$) and hydrogen peroxide ($H_2O_2$) may be used to selectively remove a titanium nitride.

Through a wet-etch process, the capping spacers 37A are etched from the lower portions of the bit lines 34. When the capping spacers 37A are removed, the first spacer layer 36 and the second spacers 38A are not etched due to their etch selectivity.

As described above, when a portion of each capping spacer 37A is etched from the lower sidewalls of the bit lines 34, air gaps 41 are formed. Air gaps 41, which are empty space between the first spacer layer 36 and the second spacers 38A, are formed. After the formation of the air gaps 41, capping spacers 37B are formed in an isolated structure surrounding the upper portions and upper sidewalls of the hard mask layer patterns 35 between the first spacer layer 36 and the second spacers 38A. As a result, the air gaps 41 are disposed under the capping spacers 37B. The capping spacers 37B have an isolated structure surrounding the upper portions and upper sidewalls of the hard mask layer patterns 35. The height of the air gaps 41 may be at least the same as or higher than the upper surface of the bit lines 34.

Figure 14E:
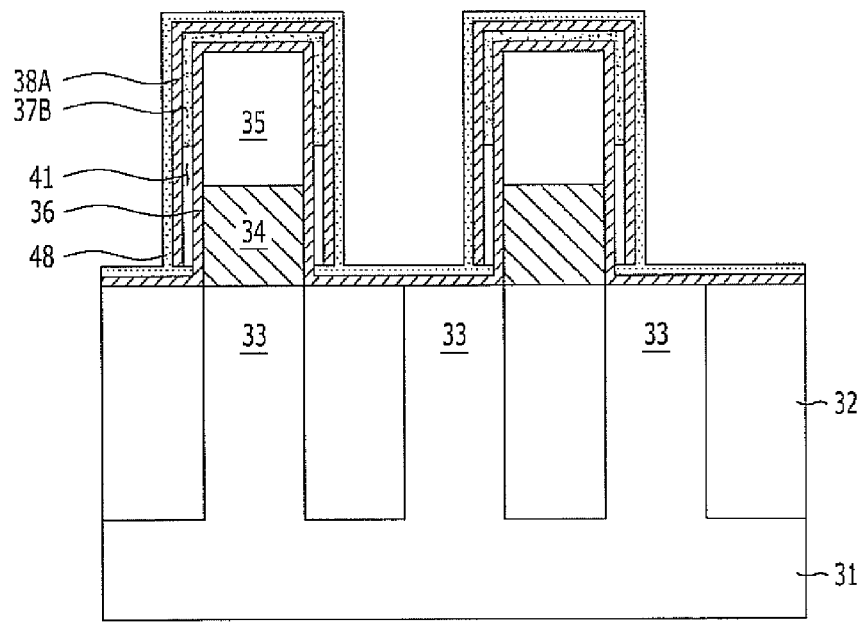

Referring to FIG. 14E, an air gap lower capping layer 48 is formed over the semiconductor substrate 31 between the bit line structures where the air gaps 41 are formed. The air gap lower capping layer 48 may be formed conformally. The air gap lower capping layer 48 may include an insulation layer, such as an oxide layer and a nitride layer.

Figure 14F:
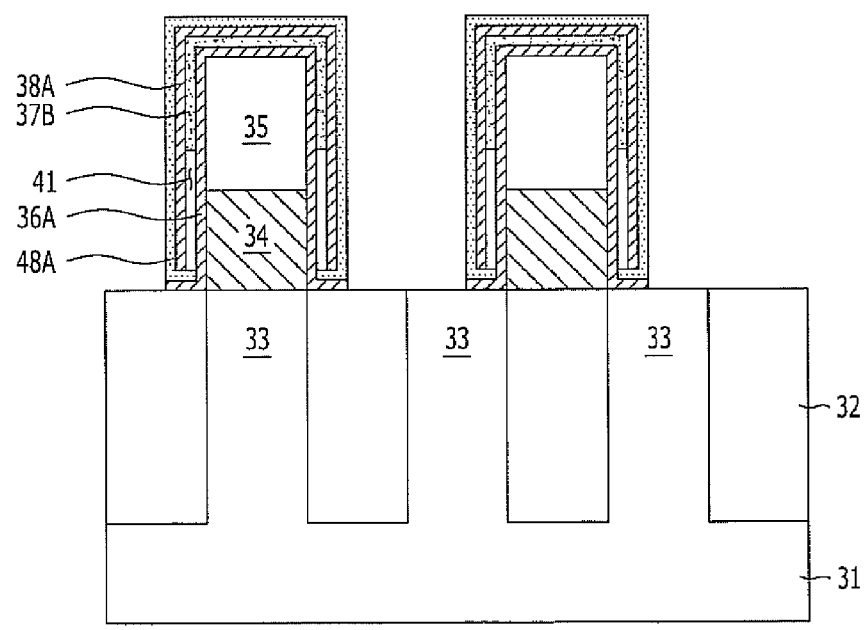

Referring to FIG. 14F, the air gap lower capping layer 48 and the first spacer layer 36 are etched back. As a result, the surface of the semiconductor substrate 31 is exposed. After the etch-back process, and an air gap lower capping layer 48A and first spacers 36A are formed. The air gap lower capping layer 48A covers the second spacers 38A. The air gap lower capping layer 48A remains in the upper portion and both sidewalls of each bit line structure. During the etch-back process, the second spacers 38A are not exposed in the upper portions of the hard mask layer patterns 35.

Figure 14G:
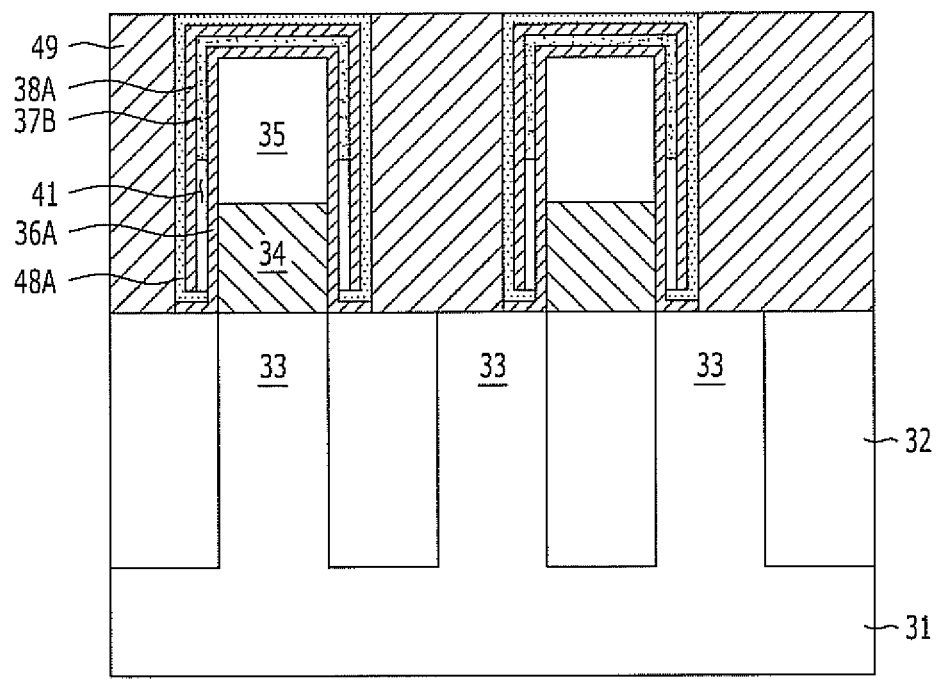

Referring to FIG. 14G, a second conductive layer (not shown) is formed over the profile of the substrate structure including the air gap lower capping layer 48A. The second conductive layer may be formed of a polysilicon doped with an impurity, a metal, a metal nitride, or a metal silicide. The second conductive layer may be formed of any one among the named materials, or a stacked structure including two or more of the named materials.

Subsequently, the second conductive layer is planarized. The planarization of the second conductive layer stops at the air gap lower capping layer 48A. As a result, storage node contact plugs 49 are formed.

As described above, when the storage node contact plugs 49 are formed, spacers having the air gaps 41 between the bit lines 34 and the storage node contact plugs 49 are formed. The air gap lower capping layer 48A hermetically seals the lower portions of the air gaps 41. The air gaps 41 may reduce the parasitic capacitance between the bit lines 34 and the storage node contact plugs 49, because the air gaps 41 have a dielectric constant of '1'.

In accordance with the embodiment of the present invention, it is not required to additionally form a capping layer for hermetically sealing the air gaps 41. In other words, since the air gaps 41 are formed by removing a portion of each capping spacer 37A from the lower portion of each bit line 34, the capping spacers 37A for capping the air gaps 41 are formed to be self-aligned.

Also, the air gap lower capping layer 48A not only hermetically seals the lower portions of the air gaps 41 but also prevents the bit lines 34 and the storage node contact plugs 49 from shorting.

According to an embodiment of the present invention, parasitic capacitance may be reduced by forming air gaps, which have a low dielectric constant, between bit lines and storage node contact plugs. As a result, sensing margin may be improved and the operation speed of a semiconductor device may be increased.

Also, capping spacers for capping the air gaps may be formed to be self-aligned by removing a portion of each capping spacer from the lower sidewall of each bit line and forming the air gaps. Therefore, it is not required to form a capping layer for covering the upper portion of the air gaps.

In addition, the technology of the present invention not only hermetically seals the lower portion of the air gaps with an air gap lower capping layer, but also prevents an electrical short from occurring between the bit lines and the storage node contact plugs.

While the present invention has been described with respect to the specific embodiments, it will be apparent to those skilled in the art that various changes and modifications may be made without departing from the spirit and scope of the invention as defined in the following claims.

What is claimed is:

1. A method for fabricating a semiconductor device, comprising:
    forming a plurality of bit line structures over a substrate;
    forming multiple layers of spacer layers with a capping layer interposed therebetween over the bit line structures;
    exposing a surface of the substrate by selectively etching the spacer layers;
    forming air gaps and capping spacers for covering upper portions of the air gaps by selectively etching the capping layer; and
    forming storage node contact plugs between the bit line structures.

2. The method of claim 1, wherein the forming of the air gaps and the capping spacers for covering the upper portions of the air gaps by selectively etching the capping layer includes:
    performing an etch-back process on the spacer layers; and
    forming the air gaps by selectively removing the capping layer from lower portions of the bit line structures.

3. The method of claim 2, wherein the air gaps are formed through a wet etch process.

4. The method of claim 1, wherein in the forming of the multiple layers of the spacer layers with the capping layer interposed therebetween over the bit line structures,
    the spacer layers have a structure where an oxide layer is formed between nitride layers.

5. The method of claim 4, wherein in the forming of the air gaps and the capping spacers for covering the upper portions of the air gaps by selectively etching the capping layer,
    a chemical including hydrogen fluoride (HF) as a major component is used.

6. The method of claim 1, wherein in the forming of the multiple layers of the spacer layers with the capping layer interposed therebetween over the bit line structures,
    the spacer layers have a structure where a titanium nitride layer is formed between oxide layers.

7. The method of claim 6, wherein in the forming of the air gaps and the capping spacers for covering the upper portions of the air gaps by selectively etching the capping layer,
    a chemical including sulfuric acid ($H_2SO_4$) and hydrogen peroxide ($H_2O_2$) as major components is used.

8. A method for fabricating a semiconductor device, comprising:
    forming a plurality of bit line structures over a substrate;
    forming multiple layers of spacer layers with a capping layer interposed therebetween over the bit line structures;
    exposing a surface of the substrate by selectively etching the spacer layers;
    forming air gaps and capping spacers for capping upper portions of the air gaps by selectively etching the capping layer;
    forming an air gap lower capping layer for capping lower portions of the air gaps; and
    forming storage node contact plugs between the bit line structures where the air gap lower capping layer is formed.

9. The method of claim 8, wherein the forming of the air gap lower capping layer for capping the lower portions of the air gaps includes:
    forming a silicon layer over the substrate through a Selective Epitaxial Growth (SEG) process.

10. The method of claim 8, wherein the forming of the air gap lower capping layer for capping the lower portions of the air gaps includes:
    forming an insulation layer over a profile of the substrate where the air gaps are formed; and
    performing an etch-back process on the insulation layer.

11. The method of claim 10, wherein the insulation layer includes an oxide layer or a nitride layer.

12. The method of claim 8, wherein the forming of the air gap lower capping layer for capping the lower portions of the air gaps includes:
    forming a polysilicon layer over the substrate.

13. The method of claim 8, wherein the forming of the air gaps and the capping spacers for capping the upper portions of the air gaps by selectively etching the capping layer includes:
    performing an etch-back process on the spacer layers; and
    forming the air gaps by selectively removing the capping layer from lower portions of the bit line structures.

14. The method of claim 13, wherein the air gaps are formed through a wet etch process.

15. The method of claim 8, wherein in the forming of the multiple layers of the spacer layers with the capping layer interposed therebetween over the bit line structures,
    the spacer layers have a structure where an oxide layer is formed between nitride layers.

16. The method of claim 15, wherein in the forming of the air gaps and the capping spacers for capping the upper portions of the air gaps by selectively etching the capping layer,
    a chemical including hydrogen fluoride (HF) as a major component is used.

17. The method of claim 8, wherein in the forming of the multiple layers of the spacer layers with the capping layer interposed therebetween over the bit line structures,
    the spacer layers have a structure where a titanium nitride layer is formed between oxide layers.

18. The method of claim 17, wherein in the forming of the air gaps and the capping spacers for capping the upper portions of the air gaps by selectively etching the capping layer, a chemical including sulfuric acid ($H_2SO_4$) and hydrogen peroxide ($H_2O_2$) as major components is used.

19. A method for fabricating a semiconductor device, comprising:
   forming a plurality of bit line structures over a substrate;
   forming a capping layer over the bit line structures;
   forming a spacer layer over the capping layer;
   exposing a surface of the substrate by selectively etching the spacer layer and the capping layer;
   forming air gaps and capping spacers for capping upper portions of the air gaps by selectively etching the capping layer;
   forming an air gap lower capping layer for capping lower portions of the air gaps; and
   forming storage node contact plugs between the bit line structures where the air gap lower capping layer is formed.

20. The method of claim 19, wherein the forming of the air gap lower capping layer for capping the lower portions of the air gaps includes:
   forming a silicon layer over the substrate through a Selective Epitaxial Growth (SEG) process.

21. The method of claim 19, wherein the forming of the air gap lower capping layer for capping the lower portions of the air gaps includes:
   forming an insulation layer over a profile of the substrate where the air gaps are formed; and
   performing an etch-back process on the insulation layer.

22. The method of claim 21, wherein the insulation layer includes an oxide layer or a nitride layer.

23. The method of claim 19, wherein the forming of the air gap lower capping layer for capping the lower portions of the air gaps includes:
   forming a polysilicon layer over the substrate.

24. A method for fabricating a semiconductor device, comprising:
   forming a plurality of bit line structures over a substrate;
   forming a first spacer layer over the bit line structures;
   forming a capping layer and a second spacer layer over the first spacer layer;
   selectively etching the second spacer layer and the capping layer;
   forming air gaps and capping spacers for capping upper portions of the air gaps by selectively etching the capping layer;
   forming an air gap lower capping layer for capping lower portions of the air gaps;
   exposing a surface of the substrate by selectively etching the air gap lower capping layer and the first spacer layer; and
   forming storage node contact plugs between the bit line structures.

25. The method of claim 24, wherein the first spacer layer and the second spacer layer include a nitride layer, and the capping layer includes an oxide layer.

26. The method of claim 24, wherein the first spacer layer and the second spacer layer include an oxide layer, and the capping layer includes a titanium nitride layer.

27. The method of claim 24, wherein the air gap lower capping layer includes an insulation layer.

28. A semiconductor device, comprising:
   a plurality of bit line structures provided over a substrate;
   a plurality of storage node contact plugs located between the bit line structures;
   air gaps formed between the bit line structures and the storage node contact plugs;
   capping spacers configured to cover upper portions of the air gaps and upper portions of the bit line structures;
   spacers configured to cover the bit line structures and the capping spacers; and
   an air gap lower capping layer configured to cover the spacers while capping lower portions of the air gaps.

29. The semiconductor device of claim 28, wherein the air gap lower capping layer includes an insulation layer.

30. The semiconductor device of claim 28, wherein the air gap lower capping layer includes a silicon-containing material.

* * * * *